US009266294B2

(12) United States Patent
Widman et al.

(10) Patent No.: US 9,266,294 B2
(45) Date of Patent: Feb. 23, 2016

(54) APPARATUS FOR FORMATION OF AN OPHTHALMIC LENS PRECURSOR AND LENS

(71) Applicant: Johnson & Johnson Vision Care, Inc., Jacksonville, FL (US)

(72) Inventors: Michael F. Widman, Jacksonville, FL (US); John B. Enns, Jacksonville, FL (US); P. Mark Powell, Jacksonville, FL (US); Peter W. Sites, Orange Park, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 0 days.

(21) Appl. No.: 13/685,413

(22) Filed: Nov. 26, 2012

(65) Prior Publication Data

US 2013/0075577 A1    Mar. 28, 2013

Related U.S. Application Data

(62) Division of application No. 12/194,981, filed on Aug. 20, 2008, now Pat. No. 8,317,505.

(60) Provisional application No. 60/957,069, filed on Aug. 21, 2007.

(51) Int. Cl.
*B28B 17/00* (2006.01)
*B29C 39/26* (2006.01)
*B29D 11/00* (2006.01)
*G02C 7/04* (2006.01)

(52) U.S. Cl.
CPC ............ *B29D 11/0073* (2013.01); *B29C 39/26* (2013.01); *B29D 11/00009* (2013.01); *B29D 11/00134* (2013.01); *G02C 7/04* (2013.01)

(58) Field of Classification Search
USPC ........................................ 425/174.4
See application file for complete search history.

(56) References Cited

U.S. PATENT DOCUMENTS

| | | | |
|---|---|---|---|
| 3,658,528 A | 4/1972 | Berman | |
| 3,916,033 A | 10/1975 | Merrill | |
| 4,701,288 A * | 10/1987 | Cook et al. ................. | 264/1.38 |
| 4,702,574 A | 10/1987 | Bawa | |
| 4,988,274 A * | 1/1991 | Kenmochi ................ | 425/174.4 |
| 5,114,628 A | 5/1992 | Hofer | |
| 5,166,710 A | 11/1992 | Hofer | |

(Continued)

FOREIGN PATENT DOCUMENTS

| | | |
|---|---|---|
| CN | 101017208 A | 8/2007 |
| EP | 0207640 A2 | 1/1987 |

(Continued)

OTHER PUBLICATIONS

Cabral, J.T., et al; Propagating waves of network formation induced by light, Polymer 46 (2005) pp. 4230-4241.

(Continued)

*Primary Examiner* — Tahseen N Khan

(57) ABSTRACT

This invention discloses apparatus for generating an ophthalmic lens with at least a portion of one surface free-formed from a Reactive Mixture. In some embodiments, an ophthalmic lens is formed on a substrate with an arcuate optical quality surface via a source of actinic radiation controllable to cure a definable portion of a volume of Reactive Mixture.

13 Claims, 19 Drawing Sheets

(56) References Cited

U.S. PATENT DOCUMENTS

| | | |
|---|---|---|
| 5,182,056 A | 1/1993 | Spence |
| 5,200,121 A | 4/1993 | Hagmann |
| 5,219,497 A | 6/1993 | Blum |
| 5,396,045 A | 3/1995 | Opdyke |
| 5,452,031 A | 9/1995 | Ducharme |
| 5,462,700 A | 10/1995 | Beeson |
| 5,502,518 A | 3/1996 | Lieberman |
| 5,517,260 A | 5/1996 | Glady |
| 5,650,837 A | 7/1997 | Roffman |
| 5,662,706 A | 9/1997 | Legerton |
| 5,685,420 A | 11/1997 | Martin |
| 5,730,911 A | 3/1998 | Cano et al. |
| 5,782,460 A | 7/1998 | Kretzschmar et al. |
| 5,983,201 A | 11/1999 | Fay |
| 6,086,204 A | 7/2000 | Magnante |
| 6,142,628 A | 11/2000 | Saigo |
| 6,145,988 A | 11/2000 | Manfredini |
| 6,200,646 B1 | 3/2001 | Neckers |
| 6,233,102 B1 | 5/2001 | Hogan, Jr. |
| 6,241,355 B1 | 6/2001 | Barsky |
| 6,305,802 B1 | 10/2001 | Roffman |
| 6,340,229 B1 | 1/2002 | Lieberman |
| 6,413,251 B1 | 7/2002 | Williams |
| 6,439,870 B1 | 8/2002 | Marceau et al. |
| 6,457,826 B1 | 10/2002 | Lett |
| 6,471,891 B1 | 10/2002 | Cameron |
| 6,499,843 B1 | 12/2002 | Cox |
| 6,520,958 B1 | 2/2003 | Shimmick |
| 6,595,639 B1 | 7/2003 | Ho |
| 6,598,975 B2 | 7/2003 | Liang |
| 6,616,275 B1 | 9/2003 | Dick |
| 6,626,534 B1 | 9/2003 | DiMartino |
| 6,800,225 B1 | 10/2004 | Hagmann et al. |
| 6,827,885 B2 | 12/2004 | Altmann et al. |
| 6,842,223 B2 | 1/2005 | Tyminski |
| 6,935,743 B2 | 8/2005 | Shadduck |
| 6,966,649 B2 | 11/2005 | Shadduck |
| 6,997,428 B1 | 2/2006 | Andino et al. |
| 7,029,119 B2 | 4/2006 | Youssefi |
| 7,128,866 B1 | 10/2006 | Henningsen |
| 7,172,285 B1 | 2/2007 | Altmann |
| 7,235,195 B2 | 6/2007 | Andino et al. |
| 7,293,871 B2 | 11/2007 | Dreher |
| 7,350,920 B2 | 4/2008 | Levine |
| 7,384,146 B2 | 6/2008 | Covannon |
| 7,431,454 B2 | 10/2008 | Hoffmann et al. |
| 7,860,594 B2 | 12/2010 | Andino et al. |
| 7,905,594 B2 | 3/2011 | Widman |
| 2001/0047217 A1 | 11/2001 | Buazza et al. |
| 2002/0024631 A1 | 2/2002 | Roffman |
| 2002/0071094 A1 | 6/2002 | Roffman |
| 2002/0071097 A1 | 6/2002 | Ross |
| 2002/0140902 A1 | 10/2002 | Guirao |
| 2002/0154271 A1 | 10/2002 | Donitzky |
| 2003/0003295 A1 | 1/2003 | Dreher |
| 2003/0007123 A1 | 1/2003 | Broderick |
| 2003/0030161 A1 | 2/2003 | Pegram |
| 2003/0053031 A1 | 3/2003 | Wirth |
| 2003/0117580 A1 | 6/2003 | Franz |
| 2003/0128336 A1 | 7/2003 | Jethmalani |
| 2003/0142267 A1 | 7/2003 | Gemert et al. |
| 2004/0004287 A1 | 1/2004 | Shimizu et al. |
| 2004/0015261 A1 | 1/2004 | Hofmann |
| 2004/0041287 A1 | 3/2004 | Engardio |
| 2004/0046287 A1 | 3/2004 | Andino |
| 2004/0046931 A1 | 3/2004 | Legerton |
| 2004/0054358 A1 | 3/2004 | Cox |
| 2004/0064376 A1 | 4/2004 | Yoshida |
| 2004/0100619 A1 | 5/2004 | Olivier |
| 2004/0114101 A1 | 6/2004 | Thakrar |
| 2004/0119174 A1 | 6/2004 | Hofmann |
| 2004/0169820 A1 | 9/2004 | Dai |
| 2004/0169932 A1 | 9/2004 | Esch |
| 2004/0179167 A1 | 9/2004 | Dahi |
| 2004/0215525 A1 | 10/2004 | Keane |
| 2004/0222539 A1 | 11/2004 | Hagmann |
| 2004/0233382 A1 | 11/2004 | Lindacher |
| 2004/0246440 A1 | 12/2004 | Andino |
| 2004/0263779 A1 | 12/2004 | Schroder |
| 2004/0263785 A1 | 12/2004 | Chernyak |
| 2005/0041203 A1 | 2/2005 | Lindacher |
| 2005/0056954 A1 | 3/2005 | Devlin |
| 2005/0060196 A1 | 3/2005 | Tsushi |
| 2005/0068489 A1 | 3/2005 | Hall |
| 2005/0073648 A1 | 4/2005 | Toshima |
| 2005/0074616 A1 | 4/2005 | Harchanko |
| 2005/0089670 A1 | 4/2005 | Large |
| 2005/0090612 A1 | 4/2005 | Soane |
| 2005/0098478 A1 | 5/2005 | Gupta |
| 2005/0099595 A1 | 5/2005 | Lindacher |
| 2005/0105044 A1 | 5/2005 | Warden |
| 2005/0105045 A1 | 5/2005 | Legerton |
| 2005/0105048 A1* | 5/2005 | Warden .......... B24B 13/00 351/159.01 |
| 2005/0122472 A1 | 6/2005 | Fisher |
| 2005/0131398 A1 | 6/2005 | Campbell |
| 2005/0219461 A1 | 10/2005 | Hirohara |
| 2005/0259221 A1 | 11/2005 | Marmo |
| 2005/0264756 A1 | 12/2005 | Esch |
| 2005/0275137 A1 | 12/2005 | Stolpe |
| 2006/0001184 A1 | 1/2006 | Phelan |
| 2006/0055071 A1 | 3/2006 | Kendig |
| 2006/0055884 A1 | 3/2006 | Molinari |
| 2006/0100408 A1 | 5/2006 | Powell et al. |
| 2006/0173644 A1 | 8/2006 | Dai |
| 2006/0192310 A1 | 8/2006 | Lindacher |
| 2006/0192919 A1 | 8/2006 | Lindacher |
| 2006/0232743 A1 | 10/2006 | Legerton |
| 2006/0256451 A1 | 11/2006 | Schaack |
| 2006/0264917 A1 | 11/2006 | Tuan |
| 2006/0268225 A1 | 11/2006 | Lieberman |
| 2006/0279696 A1 | 12/2006 | Perez |
| 2007/0023942 A1 | 2/2007 | Andino |
| 2007/0038202 A1 | 2/2007 | Celestino |
| 2007/0091259 A1 | 4/2007 | Svochak |
| 2007/0097318 A1 | 5/2007 | Chehab |
| 2007/0103639 A1 | 5/2007 | Nellissen et al. |
| 2007/0109497 A1 | 5/2007 | Chang |
| 2007/0132949 A1 | 6/2007 | Phelan |
| 2007/0260349 A1 | 11/2007 | John et al. |
| 2007/0273828 A1 | 11/2007 | Polland |
| 2007/0274626 A1 | 11/2007 | Sabeta |
| 2007/0284770 A1 | 12/2007 | Ansell |
| 2007/0285760 A1 | 12/2007 | Ho |
| 2008/0013043 A1 | 1/2008 | Ye |
| 2008/0017977 A1 | 1/2008 | Tseng |
| 2008/0043200 A1 | 2/2008 | Ishak |
| 2008/0055545 A1 | 3/2008 | Clamp |
| 2008/0067702 A1 | 3/2008 | Yao |
| 2008/0079184 A1 | 4/2008 | Yin |
| 2008/0079895 A1 | 4/2008 | Jubin |
| 2008/0137030 A1 | 6/2008 | Hoffman |
| 2008/0143003 A1 | 6/2008 | Phelan |
| 2008/0143004 A1 | 6/2008 | De Wilt |
| 2008/0143960 A1 | 6/2008 | MacRae |
| 2008/0143963 A1 | 6/2008 | Lindacher |
| 2008/0165324 A1 | 7/2008 | Lindacher |
| 2008/0179770 A1 | 7/2008 | Rooney |
| 2008/0192201 A1 | 8/2008 | Wengler |
| 2008/0277811 A1 | 11/2008 | Miller |
| 2008/0288369 A1 | 11/2008 | Hunter |
| 2008/0291395 A1 | 11/2008 | Dai |
| 2008/0306573 A1 | 12/2008 | Campin |
| 2008/0309873 A1 | 12/2008 | Levecq |
| 2009/0022274 A1 | 1/2009 | Gertner |
| 2009/0033920 A1 | 2/2009 | Simpson |
| 2009/0051059 A1 | 2/2009 | Widman |
| 2009/0053351 A1* | 2/2009 | Widman .......... B29D 11/00134 425/174.4 |
| 2009/0174863 A1 | 7/2009 | Widman |

(56) References Cited

U.S. PATENT DOCUMENTS

| | | |
|---|---|---|
| 2010/0047380 A1 | 2/2010 | Widman et al. |
| 2010/0230837 A1 | 9/2010 | Zanini et al. |

FOREIGN PATENT DOCUMENTS

| | | |
|---|---|---|
| EP | 322353 | 6/1989 |
| EP | 0637471 | 2/1995 |
| EP | 637491 B1 | 11/1997 |
| EP | 1750162 A2 | 2/2007 |
| EP | 1818692 A2 | 8/2007 |
| EP | 1552336 B1 | 10/2008 |
| GB | 1449685 A | 9/1976 |
| JP | 1-198312 | 9/1989 |
| JP | 01-198312 | 9/1989 |
| JP | 2001290978 A | 10/2001 |
| JP | 2002078681 A | 3/2002 |
| JP | 2002357796 A | 12/2002 |
| JP | 2003295134 A | 10/2003 |
| RU | 2116891 C1 | 8/1998 |
| RU | 2002131799 | 8/2013 |
| WO | WO 9300816 | 1/1993 |
| WO | WO 9308016 | 4/1993 |
| WO | 9634735 A1 | 11/1996 |
| WO | WO 9729441 A1 | 8/1997 |
| WO | WO 9733742 A1 | 9/1997 |
| WO | WO 9842497 A2 | 10/1998 |
| WO | WO 9842497 A3 | 10/1998 |
| WO | WO 0102881 | 1/2001 |
| WO | 0140846 A3 | 6/2001 |
| WO | 0191995 A1 | 12/2001 |
| WO | 0221753 | 3/2002 |
| WO | WO 0233628 A2 | 4/2002 |
| WO | WO 03013832 | 2/2003 |
| WO | WO 03037716 A2 | 5/2003 |
| WO | 03058287 A2 | 6/2003 |
| WO | 03058287 A3 | 6/2003 |
| WO | WO 03077792 | 9/2003 |
| WO | 2004015481 | 2/2004 |
| WO | WO 2004022318 A2 | 3/2004 |
| WO | WO 2004034095 | 4/2004 |
| WO | WO 2004039554 A2 * | 5/2004 |
| WO | WO 2004022318 A3 | 6/2004 |
| WO | WO 2004055573 A1 | 7/2004 |
| WO | WO 2007112306 A1 | 10/2004 |
| WO | WO 2005005121 A2 | 1/2005 |
| WO | WO 2005005121 A3 | 1/2005 |
| WO | WO 2005007386 A2 | 1/2005 |
| WO | WO 2005007386 A3 | 1/2005 |
| WO | WO 2005098478 A1 | 10/2005 |
| WO | WO 2006010632 A1 | 2/2006 |
| WO | WO 2006034864 A1 | 4/2006 |
| WO | 2006029281 A3 | 5/2006 |
| WO | 2006047698 | 5/2006 |
| WO | WO 2009025848 A2 | 2/2009 |

OTHER PUBLICATIONS

PCT International Search Report, dated May 3, 2010, for PCT Int'l Appln. No. PCT/US2010/022222.

PCT International Search Report, dated Jun. 25, 2010, for PCT Int'l Appln. No. PCT/US2010/025773.

PCT International Search Report, dated Mar. 23, 2009, for PCT Int'l Appln. No. PCT/US2008/009976.

PCT International Search Report, dated Apr. 12, 2008, for PCT Int'l Appln. No. PCT/US2008/009973.

European Search Report EP 13 15 9083 Date of Completion Oct. 22, 2013.

TW Search Report ROC Patent Application No. 99102498 Date of Search Report Jul. 7 2015; Date Johnson & Johnson notified of Search Report Aug. 13, 2015.

Communication from Japanese Agent Dated Dec. 7 2014 for Japanese Patent Application No. 2014-247791.

* cited by examiner

APPARATUS FOR FORMATION OF AN OPHTHALMIC LENS PRECURSOR AND LENS

CROSS REFERENCE TO RELATED APPLICATIONS

The present application is a divisional of U.S. patent application Ser. No. 12/194,981, filed Aug. 20, 2008 (now U.S. Pat. No. 8,317,505); which claims priority to Provisional Patent Application Ser. No. 60/957,069 filed Aug. 21, 2007 "Customized Ophthalmic Lens Fabrication"; the contents of which are relied upon and incorporated by reference

FIELD OF USE

This invention describes apparatus for the fabrication of ophthalmic lenses and, more specifically, in some embodiments, the fabrication of a Lens Precursor useful for the formation of a customized contact lenses.

BACKGROUND OF THE INVENTION

Ophthalmic lenses are often made by cast molding, in which a monomer material is deposited in a cavity defined between optical surfaces of opposing mold parts. Multi-part molds used to fashion hydrogels into a useful article, such as an ophthalmic lens, can include for example, a first mold part with a convex portion that corresponds with a back curve of an ophthalmic lens and a second mold part with a concave portion that corresponds with a front curve of the ophthalmic lens. To prepare a lens using such mold parts, an uncured hydrogel lens formulation is placed between a plastic disposable front curve mold part and a plastic disposable back curve mold part.

The front curve mold part and the back curve mold part are typically formed via injection molding techniques wherein melted plastic is forced into highly machined steel tooling with at least one surface of optical quality.

The front curve and back curve mold parts are brought together to shape the lens according to desired lens parameters. The lens formulation was subsequently cured, for example by exposure to heat and light, thereby forming a lens. Following cure, the mold parts are separated and the lens is removed from the mold parts.

Cast molding of ophthalmic lenses has been particularly successful for high volume runs of a limited number of lens sizes and powers. However, the nature of the injection molding processes and equipment make it difficult to form custom lenses specific to a particular patient's eye or a particular application. Consequently, other techniques have been explored, such as: lathing a lens button and stereo lithography techniques. However, lathing requires a high modulus lens material, is time consuming and limited in the scope of the surface available and stereo lithography has not yielded a lens suitable for human use.

It is desirable therefore to have additional methods and apparatus conducive to the formation of an ophthalmic lens of a predetermined size and shape such that it can be customized to one or both of a specific patient or purpose.

SUMMARY OF THE INVENTION

The present invention is directed to apparatus for forming an ophthalmic Lens Precursor, wherein, in some embodiments, the Lens Precursor can subsequently be utilized to form an ophthalmic lens. Generally, a Reactive Mixture is exposed to source of actinic radiation via a substrate with an arcuate surface. At least a portion of the arcuate surface can include an optical quality surface. The actinic radiation is controllable to cure a portion of the Reactive Mixture in a predefined pattern. The predefined pattern can include one surface formed along the optical quality substrate surface and a second surface free formed within the volume of Reactive Mixture.

Various embodiments can include apparatus for controlling the actinic radiation, such as a homogenizer and a collimator. The source of actinic radiation can include a spatial light modulator, such as, for example a digital micromirror device. In some embodiments, the substrate can include an ophthalmic lens mold part.

Additional embodiments include a substrate supporting a Lens Precursor and a fluent removal device proximate to the Lens Precursor, wherein the fluent removal device is positioned to remove one or more of: partially reacted, reacted and unreacted Reactive Mixture and gelled material. Other aspects can include environmental controls such as mechanisms for adjusting one or more of: temperature, humidity, particulate, light and gaseous ambient during the formation of a Lens Precursor or a lens.

Some embodiments can also include a source of fixing actinic radiation suitable for forming an ophthalmic lens from a Lens Precursor. Other aspects can include processors and software storage devices capable of controlling automated apparatus discussed herein.

A first section of the apparatus provides the construct for taking the needed optical parameters and turning them into a material product that will upon subsequent production meet desired ophthalmic lens parameters. This first section, includes the Voxel based lithographic optical apparatus. By programming intensity exposure in a digital manner and delivering that exposure to discrete locations across the curved surfaces of an optic component, the apparatus causes actinic reaction to occur in a controllable and programmable manner.

One of the products that can result by processes using the Voxel lithographic optical section of this apparatus is called a Lens Precursor. This Lens Precursor has both fluent and structural regions. In a preferred embodiment, the structural regions are in large part determined by the operation of the Voxel lithographic section; however the fluent region can be determined in numerous ways while also being influenced by the Voxel lithographic section. Alternative embodiments, may form a lens from the effect of the Voxel lithographic section without going through the Lens Precursor intermediate product.

The Lens Precursor may be further processed in a second sub-section of the novel apparatus useful for processing the fluent component. This wicking section includes apparatus useful to adjust and control the amount and other characteristics of the fluent component on the Lens Precursor entity.

A still further sub-section of the apparatus includes components that allow for controlled processing of this remaining fluent material under forces that affect its fluent aspect. By controlling the flow, unique high quality surfaces may result after the fluent material is fixed in a second actinic irradiation process.

Lens outputs of these various subsections are further processed in sections useful for the measuring of the lens in both a swelled and unswelled form. As well, apparatus for hydrating and swelling the lenses include still other sub-sections of the apparatus. The result is ophthalmic lenses that achieve optical and functional requirements.

Some embodiments result from an apparatus thus formed in its sections and whole, which forms customizable ophthalmic lenses in a free-formed manner.

Further embodiments derive from the ability of an apparatus to form a Lens Precursor in a flexible and programmable fashion via Voxel-based lithographic processing.

The ability to process Lens Precursors in various forms into high quality ophthalmic lenses; include other embodiments of said novel apparatus.

Still further embodiments utilize the capability of the Voxel lithographic apparatus to form ophthalmic Lens Precursors and lenses that have features in addition to the optical characteristics of portions thereof.

Methods of utilizing the apparatus are further disclosed in the copending application entitled "Methods for Formation of an Ophthalmic Lens Precursor and Lens" filed concurrently herewith.

Accordingly, the present invention includes an apparatus for forming a customized contact lens, with varied optical performance and with varied non-optical characteristics in a flexible and programmable manner. An ophthalmic lens results comprising a varied material nature; including a hydrogel lens, and in some embodiments, a silicone hydrogel lens.

DETAILED DESCRIPTION OF THE INVENTION

Figure 1:
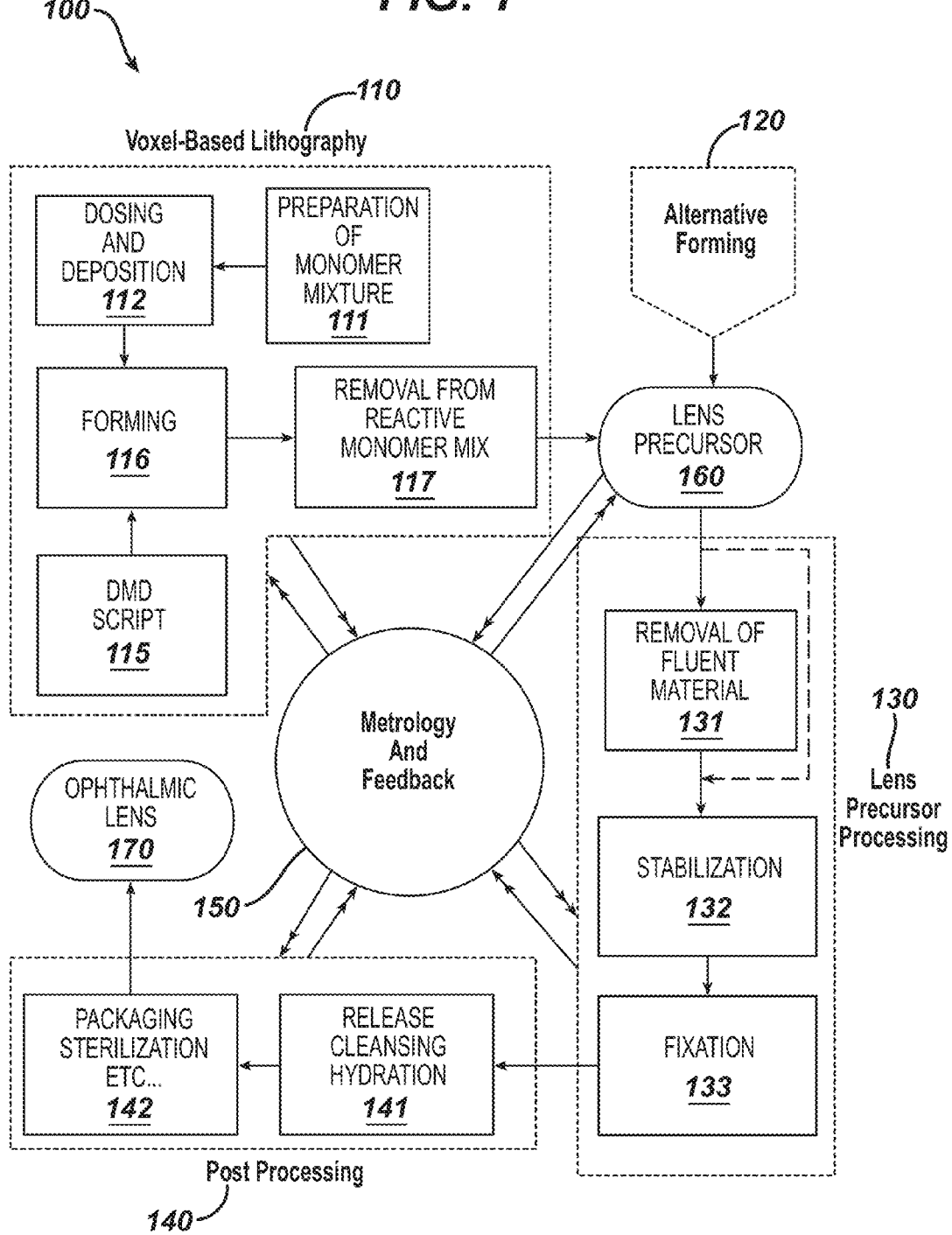
FIG. 1 illustrates method steps that may be used to implement some embodiments of the preset invention.

The present invention provides for methods and apparatus for forming a lens and for forming a Lens Precursor and preferably an ophthalmic Lens Precursor. In the following sections detailed descriptions of embodiments of the invention will be given. The description of both preferred and alternative embodiments though thorough are exemplary embodiments only, and it is understood that to those skilled in the art that variations, modifications and alterations may be apparent. It is therefore to be understood that said exemplary embodiments do not limit the broadness of the aspects of the underlying invention.

GLOSSARY

In this description and claims directed to the presented invention, various terms may be used for which the following definitions will apply:

"Actinic Radiation" as used herein, refers to radiation that is capable of initiating a chemical reaction.

"Arcuate" as used herein, refers to a curve or bend like a bow.

"Beer's Law" as referred to herein and sometimes referred to as "Beers-Lambert Law" is: $I(x)/I0=\exp(-\alpha cx)$, wherein $I(x)$ is the intensity as a function of distance x from the irradiated surface, I0 is the incident intensity at the surface, $\alpha$ is the absorption coefficient of the absorbing component, and c is the concentration of the absorbing component.

"Collimate" as used herein means to limit the cone angle of radiation, such as light that proceeds as output from an apparatus receiving radiation as an input; in some embodiments the cone angle may be limited such that proceeding light rays are parallel. Accordingly, a "collimator" includes a apparatus that performs this function and "collimated" describes the effect on radiation.

"DMD" as used herein, a digital micromirror device is a bistable spatial light modulator consisting of an array of movable micromirrors functionally mounted over a CMOS SRAM. Each mirror is independently controlled by loading data into the memory cell below the mirror to steer reflected light, spatially mapping a pixel of video data to a pixel on a display. The data electrostatically controls the mirror's tilt angle in a binary fashion, where the mirror states are either +X degrees (on) or −X degrees (off). For current devices, X can be either 10 degrees or 12 degrees (nominal). Light reflected by the on mirrors then is passed through a projection lens and onto a screen. Light is reflected off to create a dark field, and defines the black-level floor for the image. Images are created by gray-scale modulation between on and off levels at a rate fast enough to be integrated by the observer. The DMD (digital micromirror device) is sometimes DLP projection systems.

"DMD Script" as used herein shall refer to a control protocol for a spatial light modulator and also to the control signals of any system component, such as, for example, a light source or filter wheel either of which may include a series of command sequences in time. Use of the acronym DMD is not meant to limit the use of this term to any one particular type or size of spatial light modulator.

"Fixing Radiation" as used herein, refers to Actinic Radiation sufficient to one or more of: polymerize and crosslink essentially all Reactive Mixture comprising a Lens Precursor or lens.

"Fluent Lens Reactive Media" as used herein means a Reactive Mixture that is flowable in either its native form, reacted form, or partially reacted form and is formed upon further processing into a part of an ophthalmic lens.

"Free-form" as used herein "free-formed" or "free-form" refers to a surface that is formed by crosslinking of a Reactive Mixture and is not shaped according to a cast mold.

"Gel Point" as used herein shall refer to the point at which a gel or insoluble fraction is first observed. Gel point is the extent of conversion at which the liquid polymerization mixture becomes a solid. Gel point can be determined using a soxhlet experiment: Polymer reaction is stopped at different time points and the resulting polymer is analyzed to determine the weight fraction of residual insoluble polymer. The data can be extrapolated to the point where no gel is present. This point where no gel is present is the gel point. The gel point may also be determined by analyzing the viscosity of the reaction mixture during the reaction. The viscosity can be measured using a parallel plate rheometer, with the reaction mixture between the plates. At least one plate should be transparent to radiation at the wavelength used for polymerization. The point at which the viscosity approaches infinity is the gel point. Gel point occurs at the same degree of conversion for a given polymer system and specified reaction conditions.

"Lens" as used herein "lens" refers to any ophthalmic device that resides in or on the eye. These devices can provide optical correction or may be cosmetic. For example, the term lens can refer to a contact lens, intraocular lens, overlay lens, ocular insert, optical insert or other similar device through which vision is corrected or modified, or through which eye physiology is cosmetically enhanced (e.g. iris color) without impeding vision. In some embodiments, the preferred lenses of the invention are soft contact lenses are made from silicone elastomers or hydrogels, which include but are not limited to silicone hydrogels, and fluorohydrogels.

"Lens Precursor" as used herein, means a composite object consisting of a Lens Precursor Form and a Fluent Lens Reactive Mixture in contact with the Lens Precursor Form. For example, in some embodiments Fluent Lens Reactive Media is formed in the course of producing a Lens Precursor Form within a volume of Reactive Mixture. Separating the Lens Precursor Form and adhered Fluent Lens Reactive Media a from the volume of Reactive Mixture used to produce the Lens Precursor Form can generate a Lens Precursor. Additionally, a Lens Precursor can be converted to a different entity by either the removal of significant amounts of Fluent Lens Reactive Mixture or the conversion of a significant amount of Fluent Lens Reactive Media into non-fluent incorporated material.

"Lens Precursor Form" as used herein, means a non-fluent object with at least one optical quality surface which is consistent with being incorporated upon further processing into an ophthalmic lens.

"Lens Forming Mixture" as used herein, the term or "Reactive Mixture" or "RMM" (reactive monomer mixture) refers to a monomer or prepolymer material which can be cured and crosslinked or crosslinked to form an ophthalmic lens. Various embodiments can include lens forming mixtures with one or more additives such as: UV blockers, tints, photoinitiators or catalysts, and other additives one might desire in an ophthalmic lenses such as, contact or intraocular lenses.

"Mold" as used herein, refers to a rigid or semi-rigid object that may be used to form lenses from uncured formulations. Some preferred molds include two mold parts forming a front curve mold part and a back curve mold part.

"Radiation Absorbing Component" as used herein, the term "refers to radiation-absorbing component which can be combined in a reactive monomer mix formulation and which can absorb radiation in a specific wavelength range.

Reactive Mixture (also sometimes referred to herein as: Lens Forming Mixture or Reactive Monomer Mixture and with same meaning as "Lens Forming Mixture")

"Release from a mold" as used herein, "release from a mold," means that a lens becomes either completely separated from the mold, or is only loosely attached so that it can be removed with mild agitation or pushed off with a swab.

"Stereolithographic Lens Precursor" as used herein means a Lens Precursor where the Lens Precursor Form has been formed by use of a stereolithographic technique.

"Substrate" A physical entity upon which other entities are placed or formed.

"Transient Lens Reactive Media" as used herein means a Reactive Mixture that may remain in fluent or non-fluent form on a Lens Precursor Form. However, Transient Lens Reactive Media is significantly removed by one or more of: cleaning, solvating and hydration steps before it becomes incorporated into an ophthalmic lens. Therefore, for clarity, the combination of a Lens Precursor Form and the transient lens Reactive Mixture does not constitute a Lens Precursor.

"Voxel" as used herein "Voxel" or "Actinic Radiation Voxel" is a volume element, representing a value on a regular grid in three dimensional space. A Voxel can be viewed as a three dimensional pixel, however, wherein a pixel represents 2D image data a Voxel includes a third dimension. In addition, wherein Voxels are frequently used in the visualization and analysis of medical and scientific data, in the present invention, a Voxel is used to define the boundaries of an amount of actinic radiation reaching a particular volume of Reactive Mixture, thereby controlling the rate of crosslinking or polymerization of that specific volume of Reactive Mixture. By way of example, Voxels are considered in the present invention as existing in a single layer conformal to a 2-D mold surface wherein the Actinic Radiation may be directed normal to the 2-D surface and in a common axial dimension of each Voxel. As an example, specific volume of Reactive Mixture may be crosslinked or polymerized according to 768×768 Voxels.

"Voxel-based Lens Precursor" as used herein "Voxel-based Lens Precursor" means a Lens Precursor where the Lens Precursor Form has been formed by use of a Voxel-based lithographic technique.

"Xgel" as used herein, Xgel is the extent of chemical conversion of a crosslinkable Reactive Mixture at which the gel fraction becomes greater than zero.

Apparatus

The apparatus disclosed in this invention is generally presented herein in five major subsections, and the first discussion of embodiments of the apparatus will be organized into logical discussions at the subsection level. These subsections are the Voxel-based lithography optical apparatus, the wicking apparatus, the stabilization and fixing apparatus, the metrology apparatus and the hydration apparatus. Nevertheless, the subsections also function as a whole apparatus and this should be considered in light of the subsection embodiments.

Voxel-Based Lithography Optical Apparatus

The Voxel-based lithography optical apparatus is the component that uses actinic radiation to create lens forms and Lens Precursors. In the present invention, an apparatus takes highly uniform intensity radiation and controls irradiation onto the surface of a forming optic at numerous discrete points across the forming optic surface, essentially on a Voxel by Voxel basis. This control allows this component to control the degree of reaction that occurs in Reactive Mixture along the light path of a particular Voxel location; ultimately determining the volume of reacted material there and thus, the shape of a Lens Precursor Formed thereon.

Figure 5:
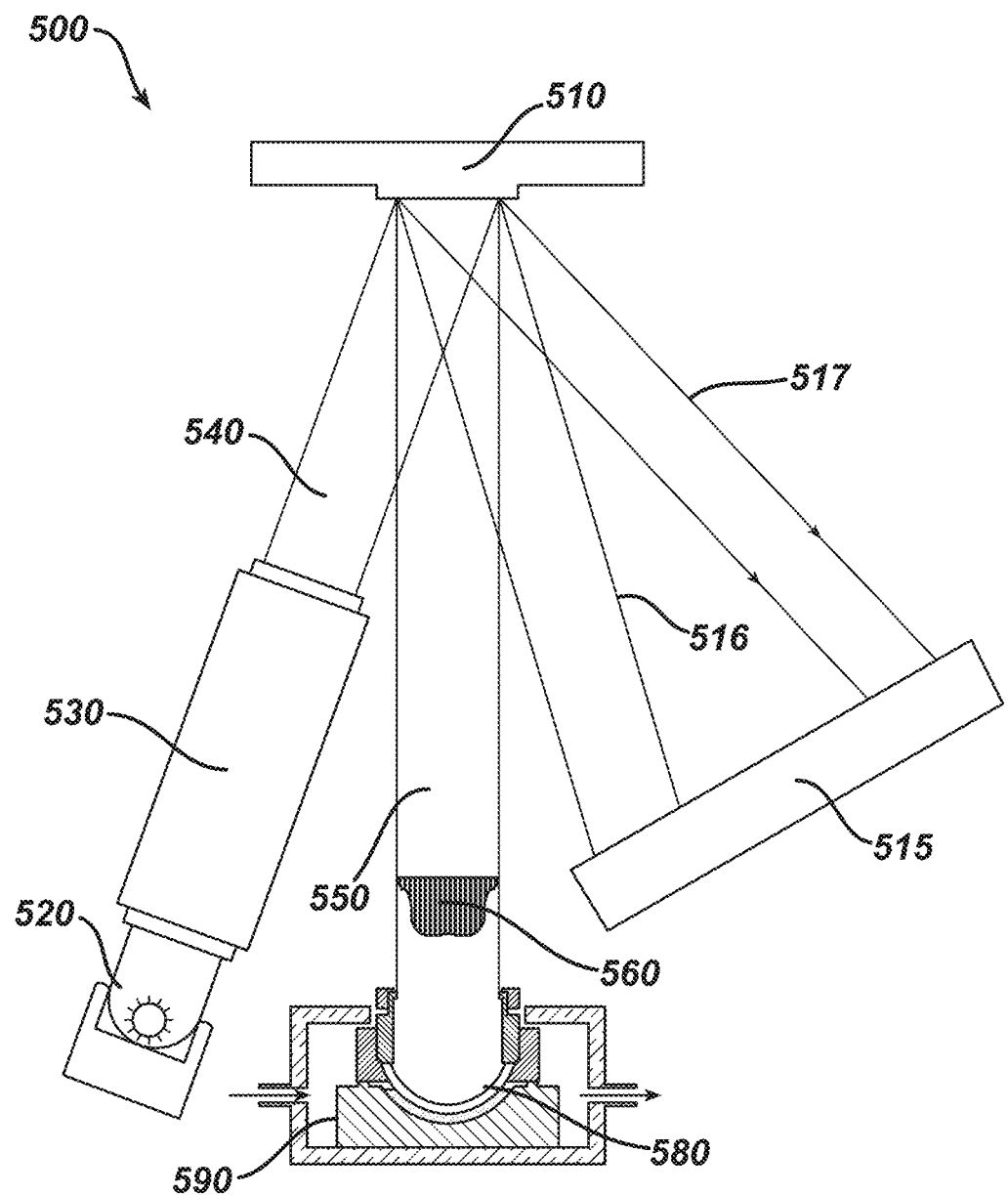
FIG. 5 illustrates apparatus components that may be useful in implementing some embodiments of the present invention comprising Voxel based lithography.

The major components of the Voxel-based lithographic optical apparatus are depicted in an exemplary embodiment in FIG. 5. Each component indicated is discussed in detail in a later section. At this point, an exemplary overview is given for the subsection functions.

Referring now to FIG. 5, forming apparatus 500, in this exemplary operation can functionally begin at the light source 520. In such embodiments, the light generated in this source 520 emerges as light in a defined band of wavelengths but with some spatial variation in intensity and direction. Element 530, a spatial intensity controller or collimator, condenses, diffuses and, in some embodiments, collimates light to create a beam of light 540, that is highly uniform in intensity. Further, in some embodiments, the beam 540 impinges on a digital mirror device DMD 510 which divides the beam into pixel elements of intensity each of which can be assigned a digital on or off value. In reality, the mirror at each pixel merely reflects light in one of two paths. The "ON" path, item 550, is the path that leads to photons proceeding toward a reactive chemical media. Conversely, in some embodiments, an "OFF" state includes a light being reflected along a different path that will lie between the paths depicted as items 516 and 517. This "OFF" path directs photons to impinge upon a beam dump 515 which has been carefully crafted to absorb and entrap any photons directed towards it. Referring back to the "on" path 550, light depicted in this path actually includes the potentially many different pixel values that have been set to the "on" value and are spatially directed along the appropriate individual path corresponding to their pixel location. A time averaged intensity of each of the pixel elements along their respective paths 550, can be represented as a spatial intensity profile 560, across the spatial grid defined by the DMD 510. Alternatively, with a constant intensity impinging each mirror, item 560 may represent a spatial time exposure profile.

Continuing, each pixel element in the on state will have photons directed along their path 550. In some embodiments the beam may be focused by a focusing element. By way of example, FIG. 5 500 depicts an embodiment where the light paths 550, are imaged so that they impinge in an essentially vertical manner upon the optic surface of a forming optic 580. The imaged light now proceeds through the forming optic 580, and into a volume of space that contains reactive lens mixture in a reservoir 590. It is the interaction of this light for a given pixel location, that defines an on state Voxel element in the volume in the reservoir 590, and around the forming optic 580. These photons in this volume may be absorbed and precipitate an actinic reaction in the molecule that absorbs it, leading to a polymerization state change of the monomer in this general vicinity.

It is in this general way for one particular embodiment that the Voxel based lithographic optic can be understood to function. Each of these elements in their own right has characteristics and embodiments that describe functional modes of this apparatus. Further understanding of the underlying invention may gain from delving into the individual complexities.

Figure 4:
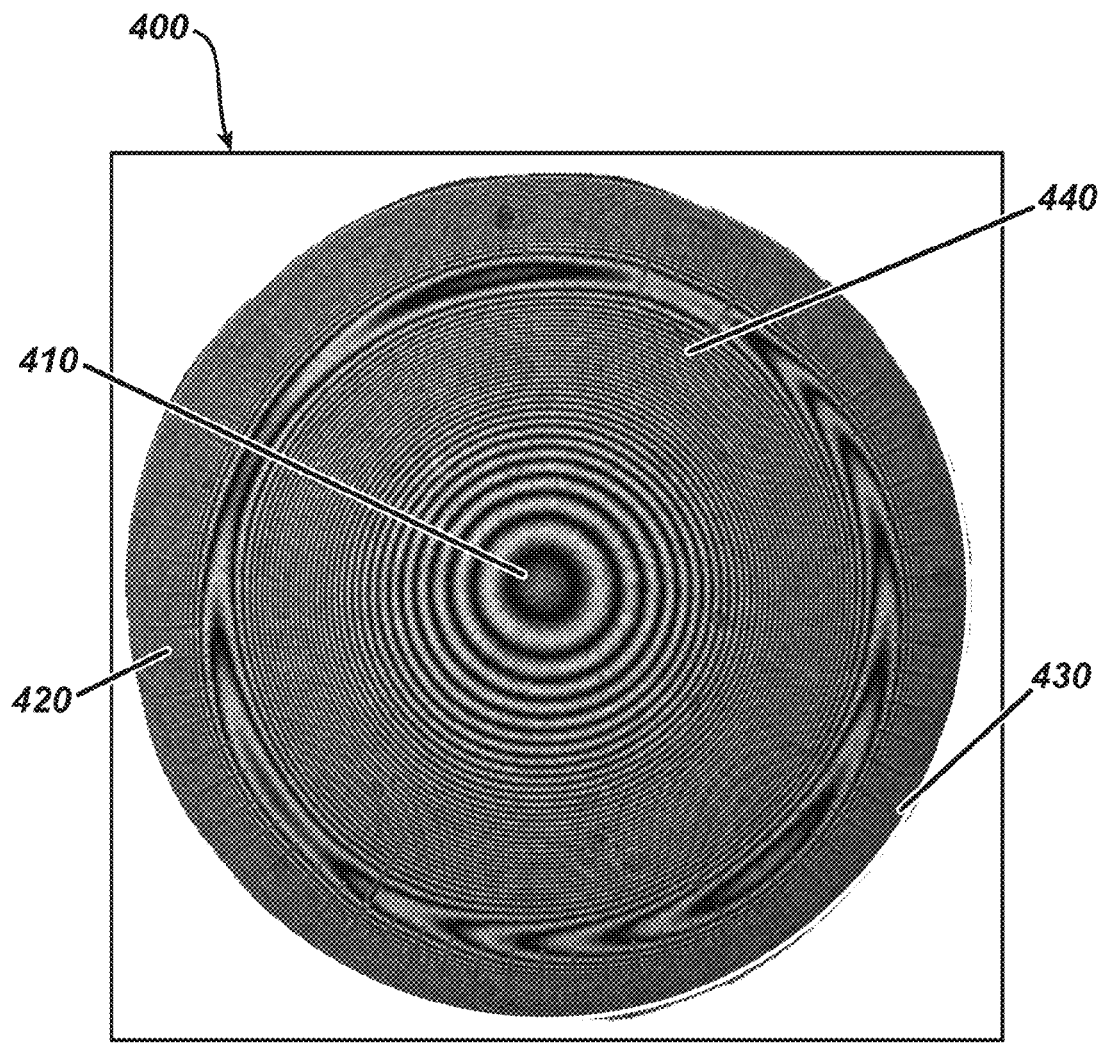
FIG. 4 illustrates an example of the lens produced with the invention herein disclosed.

Following now on the basic understanding of the apparatus function presented above, the total system will be discussed as a whole. In some embodiments, Voxel based lithographic systems as a whole are used to generate ophthalmic lenses. (A graphical representation of the wavefront surface of such a formed lens is illustrated in FIG. 4).

In some embodiments, an ambient environment, including temperature and humidity, encompassing apparatus 500 can be controlled. Other embodiments can include environments consistent with a laboratory environment and therefore can vary.

The nature of the ambient gaseous environment can be controlled, for example, through the use of purging nitrogen gas. Purging can be performed to increase or reduce oxygen partial pressure to predetermined levels. Humidity may also be maintained at relatively predetermined levels, such as at relatively lower levels than an office environment.

The level of vibrational energy that is allowed to interact with the individual apparatus components is another environmental parameter that may be controlled in some embodiments. In some embodiments, large massive support structures define a relative low vibrational environment. Other embodiments may include some or all of the Voxel-based lithographic system 500 to be supported upon active vibrational supports. Without limiting the generality of possible solution, it is well known in the art that air bladder support pistons can significantly reduce vibrational transfer into an isolated system. Other standard means of vibrational isolation may as well be consistent with the scope of the invention.

Particulates in the environment of the apparatus may introduce undesirable defect modes of various types including incorporation into the product Lens Precursors and lenses. For example, in the optic path, particulates can modulate the actual intensity of one or more Voxel elements and or affect the function of a particular mirror element. For these reasons, at a minimum, it is entirely within the scope of the invention to provide a means of controlling particulate matter in the environment. One example of an embodiment to achieve this would be the incorporation of high efficiency particulate air (HEPA) filters into the body of the apparatus environment and a means of forcing air through the filters sufficient to establish a laminar flow regime in exposed portions of the apparatus. Nevertheless, any embodiment to significantly limit particulate levels in and around the apparatus is within the intended scope of the invention.

Another aspect of the detailed environmental support for optical apparatus according to the present invention, includes the ambient light and manners to control it. In some embodiments, ambient lighting provides actinic radiation and it is therefore prudent to limit stray sources of photon energy.

Accordingly, in some embodiments, apparatus 500 can be enclosed in opaque materials consistent with the previously discussed environmental needs. A preferred embodiment may employ the use of filtered light sources in the environment of the apparatus, which may be sufficient to avoid exposure of active portions of the apparatus to contaminating environmental lighting.

Figure 6:
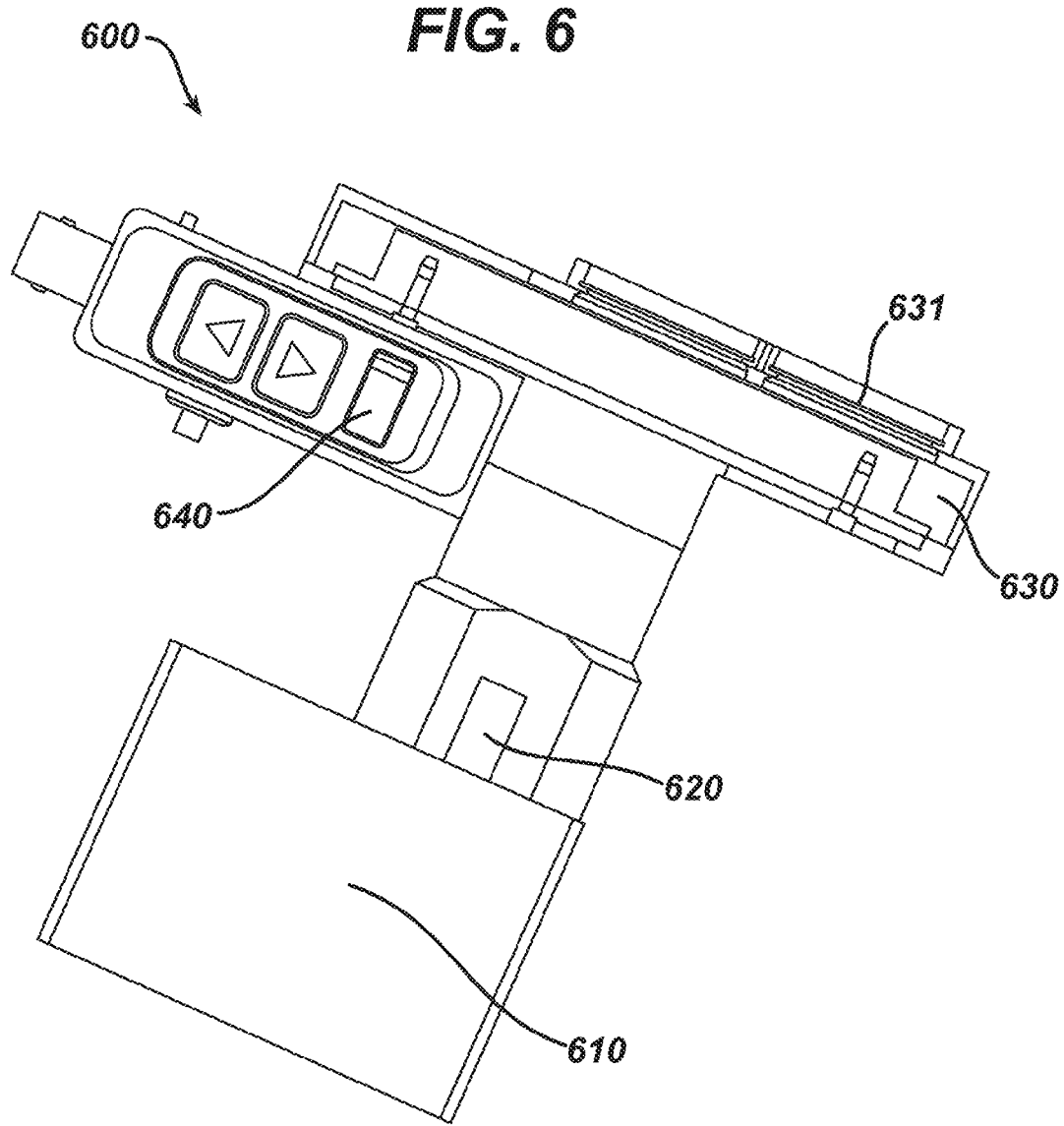
FIG. 6 illustrates exemplary light source apparatus components that may be useful in implementing some embodiments of the present invention.

Referring now to FIG. 6, consider the light source as depicted in a highlighted form 600. Specific aspects of light energy can be considered a fundamental aspect of any lithographic system and in embodiments of this invention which use the Voxel-based lithographic optical apparatus, the nature of the source of light for the system may be important.

In some embodiments it is desirable for a light source 620 to provide light in a narrow spectral band. The components of an exemplary light system 600, provide the means of accomplishing said narrow spectral character. In a preferred embodiment, a light source includes a light emitting diode 620, which exists in an environmental support and enclosure 610. For exemplary purposes, in some embodiments a light emitting diode source 620 can include the model AccuCure ULM-2-365 light source with controller from Digital Light Lab Inc. (Knoxville, Tenn. USA) This model emits a narrow band of light centered around 365 nm and further having the characteristics of a full width at half maximum breath of approximately 9 nm. Thus, this commercially available light source component already emits light in a desirable narrow band without further apparatus. It may be clear that any LED or other light emitting product with similar characteristics may also be utilized.

Alternatively, wider spectrum light sources, such as, for example carbon arc lamps or Xenon lamps 620 may also be used. In this alternative, a broad band source can be utilized 620. Light emits out of the environmental container 610 and proceeds through a filter wheel 630 deployed on the light source 620. The filter wheel 630, can contain multiple, distinct filters 631, at different operational locations and these filters 631, may, for example, include a band pass filter that will transmit light centered at 365 nm with a full width at half maximum breath of a similar 10 nm performance. In this embodiment, the filter wheel can be actuated by a motorized actuator 610 which can index the filter wheel to different filters; and therefore allow the exemplary Voxel-lithographic system embodiment 500 to operate at multiple selectable wavelengths.

It may be clear that numerous alternative embodiments may easily derive, including in a non-limiting perspective, the fact that the filter 631 may be mounted in a fixed manner proximate to the wide band light source 620 and provide an appropriate embodiment. In another aspect, a multiple wavelength capability of may be derived from an alternative embodiment where the there are multiple LED light sources 620, in the environment 610 that are activated individually for a different wavelength.

More generally, it should be apparent that some embodiments may include various light sources, including, for example, incandescent, laser, light emitting and other analogous products with or without filters of various kinds. Additionally, in some embodiments, light sources can be capable of emitting light in a controlled spectral band can be utilized and are within the scope of this invention.

The light source 600, additionally may have the characteristic of being stable, uniform and relatively intense. In the some preferred embodiments, an AccuCure LED light source 620, outputs intense light and includes an internal monitoring feedback loop to maintain a stable intensity over time periods.

A light source 620, can include means for modulating the intensity in a controlled manner; including modulating the source on and off with a defined duty cycle. Thus, over an integrated period of time, this mode of intensity control will result in selectable time averaged intensity levels. Alternatively, in an additional operational embodiment, the LED source can modulate intensity via a voltage controlled operational mode where the change in intensity occurs for the time independent level of emitted intensity.

For stability of the output of any light source component 620 additional features in the environment of the light source may include additional embodiment definitions. Examples of this aspect could include temperature control means via cooling systems. Other environmental controls may include different embodiment definitions consistent with the intent of this invention.

In a different aspect, the light source apparatus 600, provides an alternative embodiment for intensity modulation. The individual light source 620 may be operated to emit a given intensity and the filter wheel 630 may be actuated by a motorized element 610, to intercept the emitted light with a neutral density filter 631. Thus, the intensity of light provided to the rest of the Voxel-lithographic system 500 will be modulated to a lower intensity. From a generality perspective, it may be noted that the design of the individual light filters 631 may involve numerous degrees of freedom and in their own right include different embodiment aspects. By way of a non-limiting example, a filter may be designed to modulate intensity in a spatially defined manner such that it defines higher intensity along one path through its body than in another path. In a second non-limiting example, a filter wheel may be designed to modulate intensity in a manner such that it is synchronized with operation of the DMD, thereby allowing coordination of pixels and intensities defined by the density values of each filter wheel segment. Combinations of these operational modes provide alternative embodiments, and it should also be clear that any means of controlling light intensity of the characteristics thus described is within the scope of the invention.

Regardless of the embodiment of the light source component 620, and its environment, an embodiment including a filter wheel 630, can allow for an embodiment of an operational mode to shutter in a filter element 631 that acts to completely block irradiation from the rest of the optic system 500. There may be numerous advantages to incorporating such a function including the stability and longevity of downstream optic components. Additionally, in some embodiments, the stability of a light source component 620 may be improved if it is allowed to continuously operate. A blocking filter 631, may allow for means of performing steps in the rest of the operational system that require the absence of the light from the light source 600. It may be apparent to one skilled in the art that while a particular location of the filter wheel 630, has been described there may be different appropriate locations along the optic path that would include acceptable embodiments within the scope of the invention.

An additional component of a Voxel-based lithography optical apparatus includes a homogenizing and collimating optic. This apparatus is designed to take the light output of the light source 520 and produce output radiation 540 that is of more uniform intensity and is focused upon the DMD 510. From a generalization perspective it may be possible to achieve the intent of the invention in the absence of this componentry, especially if the light source has components of similar intent.

Figure 7:
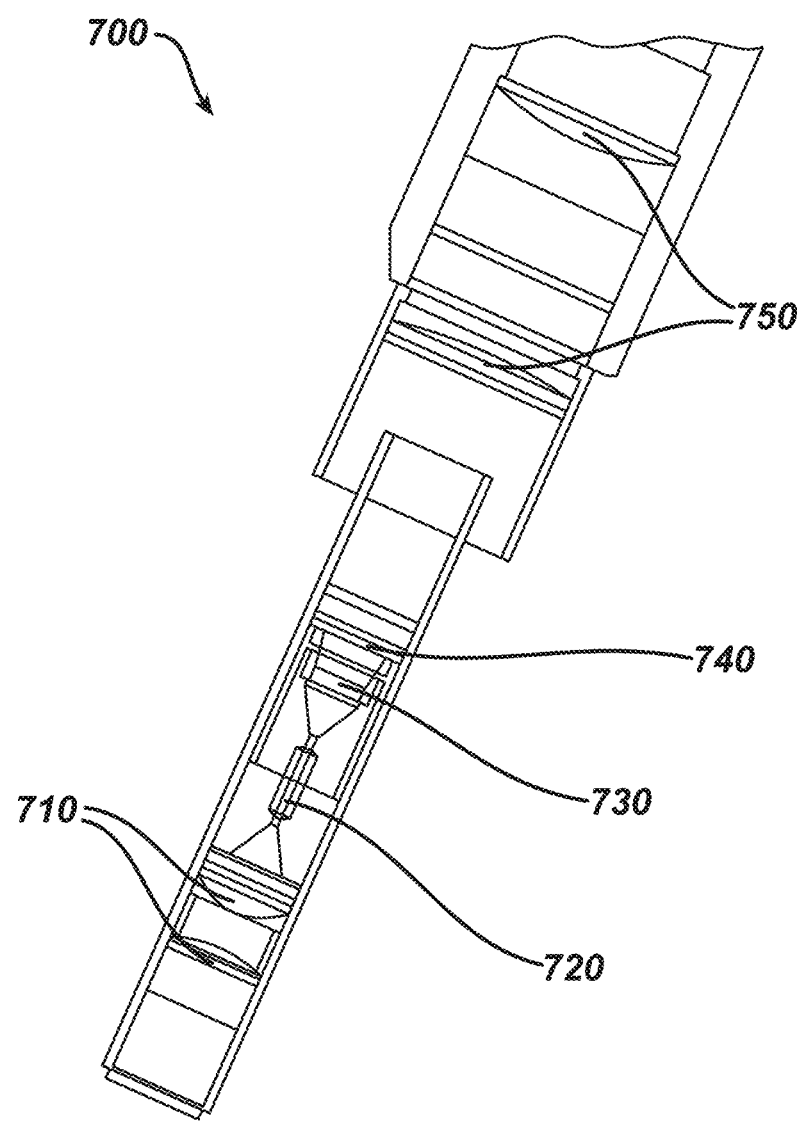
FIG. 7 illustrates exemplary optical apparatus components that may be useful in implementing some embodiments of the present invention.

The preferred embodiment is depicted in FIG. 7 700. As mentioned the purpose of this section of the apparatus is to both collimate the light from the light source and also to homogenize that light relative to intensity. It turns out that in the preferred embodiment, the AccuCure 365 nm LED light source 620, has attached optical components to perform the collimation of its light output. In a more generalized embodiment, such collimating apparatus would include the first component of this collimation and homogenization component.

In the preferred embodiment, however, the light being collimated sufficiently by the light source 620 proceeds into 700 and impinges a set of roughly 1 inch focusing optics 710. These optics are included of off the shelf lens components available for example from CVI Laser, Inc, (Albuquerque, N. Mex. USA)

These two lenses 710, focus the source light onto the light pipe 720. This component 720, has the central role of homogenizing the input light, in the process smoothing out nonuniformities in the spatial intensity. The light pipe 720 includes a hexagonal shaped optic pipe made of UV grade acrylic material. While specific details of the embodiment have been described, it should be obvious that any alternative embodiment that provides an optical apparatus for homogenizing the source light spatial uniformity includes solutions anticipated in the scope of the invention.

The homogenized light output from the light pipe 720, is focused by an off the shelf grade optic element 730 again of the type available from CVI Laser Inc. (Albuquerque, N. Mex. USA) for example. The focused light now proceeds through an aperture stop 740, on to a set of roughly 2 inch focusing elements 750. Again these focusing elements are standard, off the shelf grade optics as may be available through Thorlabs Inc. (Newton N.J. USA), by way of example. The intent of the focusing optics 750, now is to direct the light to a focal location at the digital mirror device (DMD) 510. This completes the path of light in the illumination section of Voxel-based lithographic system. There may be numerous embodiments that may alter aspects of the collimator and homogenizer components to achieve a similar aim in illuminating the DMD 510 with intense, uniform light of a desired central wavelength and spectral bandwidth, which are within the scope of the invention.

Figure 8:
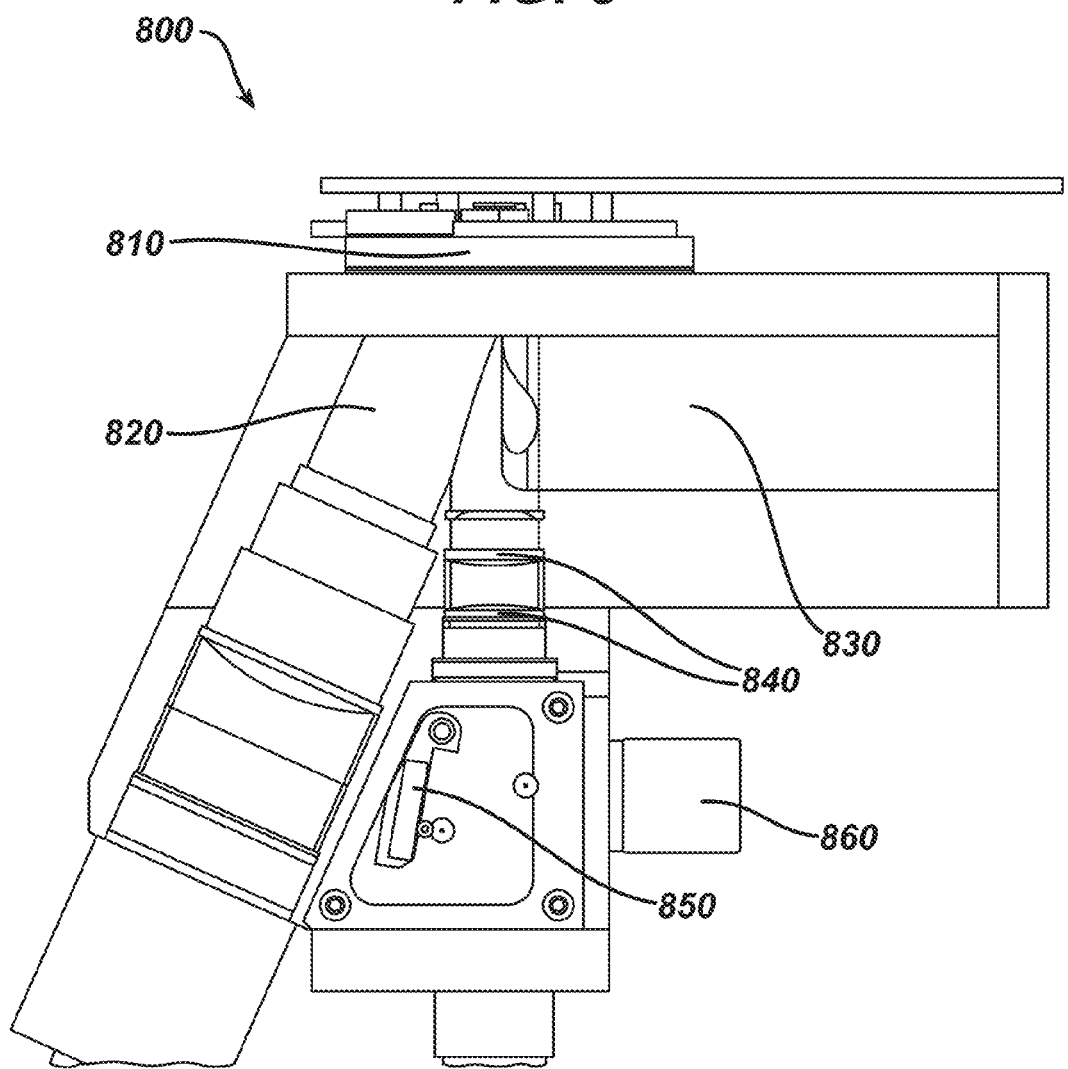
FIG. 8 illustrates exemplary digital mirror apparatus components that may be useful in implementing some embodiments of the present invention.

In the preferred embodiment, the illumination system items 520 and 530 impart light, (identified as 820 in FIG. 8 800) onto and just around the active elements comprising a Texas Instruments Digital Mirror Device 510. The DMD used in the preferred embodiment was obtained with a DMD Developer Kit: DMD Discovery 3000 available from DLi (Digital Light Innovations, Austin Tex., USA). The kit contains A DLi DMD Discovery 3000 board with a Texas Instruments DLP™ XGA DMD chip (768×1024 mirrors) 0.7" diagonal with UV transmissive window option. Also included is an ALP-3 High Speed light Processing board married to the D3000 board to act as a link from a computer to the D3000. Together these components include 810 in FIG. 8 800 of the imaging system components from this preferred embodiment of the Voxel based lithography system. A detailed description of the TI DLP™ XGA DMD may be obtained from TI as the DMD Discovery™ 3000 Digital Controller (DDC3000) Starter Kit Technical Reference Manual.

The DMD device 810 can function to provide spatial modulation in the intensity of light that exits from the illumination system. The DMD from Texas Instruments performs this function in a digital manner by reflecting light off of the micromirror components that make up a single addressable location in the spatial grid of the active area of the device. Therefore, the intensity of light that gets reflected from the DMD 810 and further down the imaging system 800, per se, is not changed however by controlling the duty cycle of the mirrors into an on state or an off state, the time averaged intensity that is reflected from a single pixel location can be modified.

In other embodiments, a Spatial Light Modulator (SLM) such as those available from Fraunhofer Institut Photonische Microsysteme of Germany can be used to control radiation on a Voxel by Voxel basis and can include the spatial modulation in intensity function 810. The mirror-like surface of the SLM may actually be composed of multiple (i.e. thousands) of tiny moveable mirrors, each mirror with its own storage cell within the integrated circuit. As the image of the desired intensity profile is sent to the SLM, individual mirrors are either flexed or remain flat (unlike the TI DMD which rotates or tilts the micromirrors). Light reflected off the flexed mirrors is scattered such that it does not pass through and expose the actinically reactive chemical mixture.

Referring now again to FIG. 8, as mentioned above, the active imaging element DMD 810 processes light in a digital manner reflecting it in one of two directions. In the off state, the path of reflection of the light is intended not to ever see the location with the actinically reactive chemical mixture. To ensure, that light directed in the off direction does not ever see this path, part of an imaging system 800 can include a light dump 830. This dump is included of highly absorptive surfaces that absorb significantly any light incident upon them and reflect only into further depths of the dump itself. In the preferred embodiment, as a non-limiting example, these surfaces include absorptive ND glass sheets as that which can be obtained from Hoya Inc. (Tokyo, Japan).

Light that is reflected from mirror elements in the "on" position takes a different path and heads towards focusing elements 840. As with the other optics these roughly 1 inch focusing lenses are off the shelf components that may for example be available from Thorlabs Inc. (Newton N.J. USA). These focusing lenses 840 focus the "on" state light emanating from the DMD 810 as an object onto the forming optic where the reaction of light with reactive monomer mixture occurs.

In some embodiments, it is desirable to provide a means of imaging and monitoring the status of the optic path directly, rather than inferring from results on lenses produced. In the preferred embodiment of the Voxel-based lithography optical apparatus, provision is provided for this direct monitoring. Light that would be focused onto the forming optic 580, is intercepted with a mirror 850, that can be switched into and out of the beam path. The light that is so directed is then incident on a photo-detective imaging apparatus 860.

Figure 9:
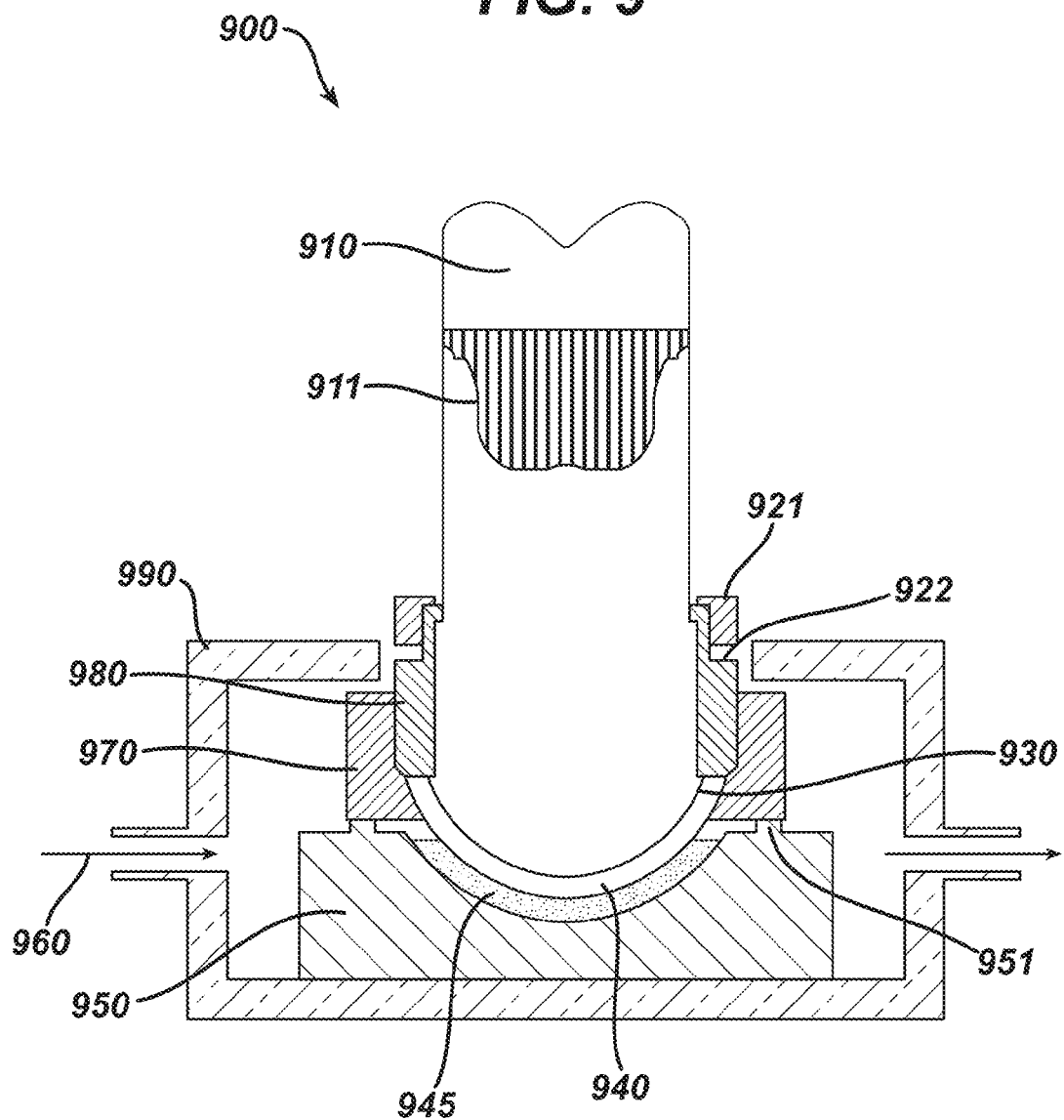
FIG. 9 illustrates additional apparatus components that may be useful in implementing some embodiments of the present invention.

Continuing now to FIG. 9, the components of the forming apparatus 900, impinge the beam on the ultimate target area of the Reactive Mixture. As mentioned above, in some embodiments, this light has been focused onto a normal orientation with the surface of the forming optic 930, itself. In the embodiment illustrated 900, the light may impinge in a roughly vertical manner to the surface of the forming optic 930. In alternative embodiments, a lens can be held in place via a retaining ring or other fastening device, demonstrated as 921, which may maintain the correct orientation of said lens relative to the forming optic 930. From a broad perspective it should be noted that the invention includes numerous embodiments related to the path light will take on a Voxel by Voxel basis across the optic surface 930.

Continuing with FIG. 9, since the relative orientation of the reservoir and forming optic to the light beam is of importance, mechanism for their interlocked location may be defined in some embodiments as demonstrated by the interaction of items a forming optic retaining member 970, and the reservoir for containing the reactive monomer mixture 950. The alignment between these two members will also provide for positive control of the centering of the reservoir 950, to the forming optic surface 930. The position control may also be enhanced in some embodiments with the function of spacing ring 951. This spacing likewise will control the volume of reactive monomer mixture that may be added to the reservoir 950.

FIG. 9 also shows an additional embodiment aspect relating to the control of ambient gasses in the neighborhood of the reactive monomer mixture. Since in some embodiments, the presence of oxygen can modify the photochemistry of the monomers and ask as a scavenger of photogenerated free radicals, in some embodiments it needs to be excluded from the gas surrounding the reservoir 950. This is accomplished in FIG. 9 900 by the containment vessel 990. By flowing an inert gas, such as nitrogen, through 960, oxygen may be excluded from the environment. In still another embodiment, the oxygen level may be maintained at a level by controlling its dilution in the gas 960, being flowed through the containment vessel 990. Standard means, through the use of gas mass flow controllers to achieve a constant dilution level of the oxygen in the gas 960 are well known art and include embodiments within the spirit of the invention.

The reservoir 950, which contains the Reactive Mixture, may be filled with an appropriate volume of said Reactive Mixture. In some embodiments, this filling could be performed before the forming optic 930, is positioned relative to the reservoir 950. In other embodiments, the forming optic 930 and the reservoir 950, may be placed inside a containment vessel 990 and subjected to the purging with a gas flow 960. Filtering of the Reactive Mixture prior to use may also be employed. Thereafter, a volume of the Reactive Mixture 945, may be quantitatively filled into the reservoir 950.

There may be numerous means to transfer the Reactive Mixture 945, including hand filling, quantitative fluid transfer by automatic means or filling until a level detector measures the appropriate level of Reactive Mixture 945 in the reservoir 950. From a general perspective it may be obvious to one skilled in the art, that numerous embodiments to transfer an appropriate amount of Reactive Mixture 945 may be practical, and such techniques are well within the scope of invention.

In embodiments where the level of oxygen is critical to the photoprocessing steps, it may be apparent that oxygen may be present as a dissolved species in the reactive monomer mixture 945. In such an embodiment, means to establish the oxygen concentration in the reactive monomer mixture 945 are required. Some embodiments to accomplish this function include allowing the mixture to dwell in the gaseous environment through which the purge gas 960, is flowing. Alternative embodiments may involve vacuum purging of the dissolved gasses in a supply of the monomer mixture and reconstituting a desired amount of oxygen during a dispensing of the mixture through membrane exchange of gas with the liquid to be dispensed. Within the scope of the invention, it should be apparent that any means to establish the needed dissolved gas at an appropriate concentration is acceptable. Furthermore, in a more general sense, other materials may act as appropriate inhibitors in the presence or absence of the dissolved oxygen. From an even more general perspective, embodiments that include apparatus to establish and maintain an appropriate level of inhibitor are anticipated in the scope of the invention.

Referring now again to FIG. 10, an exemplary shape of a forming optic and its holding and locating apparatus 1000 is illustrated. The structure that holds the forming optic can include flat glass disk 1040. The forming optic can be located and fastened by means of an optically consistent adhesive 1020 using an assembly jig to ensure alignment between the disk and the forming optic. The disk's flat surface provides positive orientation in the vertical direction, while a locating notch 1030 and other flat surfaces not illustrated can allow for radial and horizontal positional control.

Figure 11:
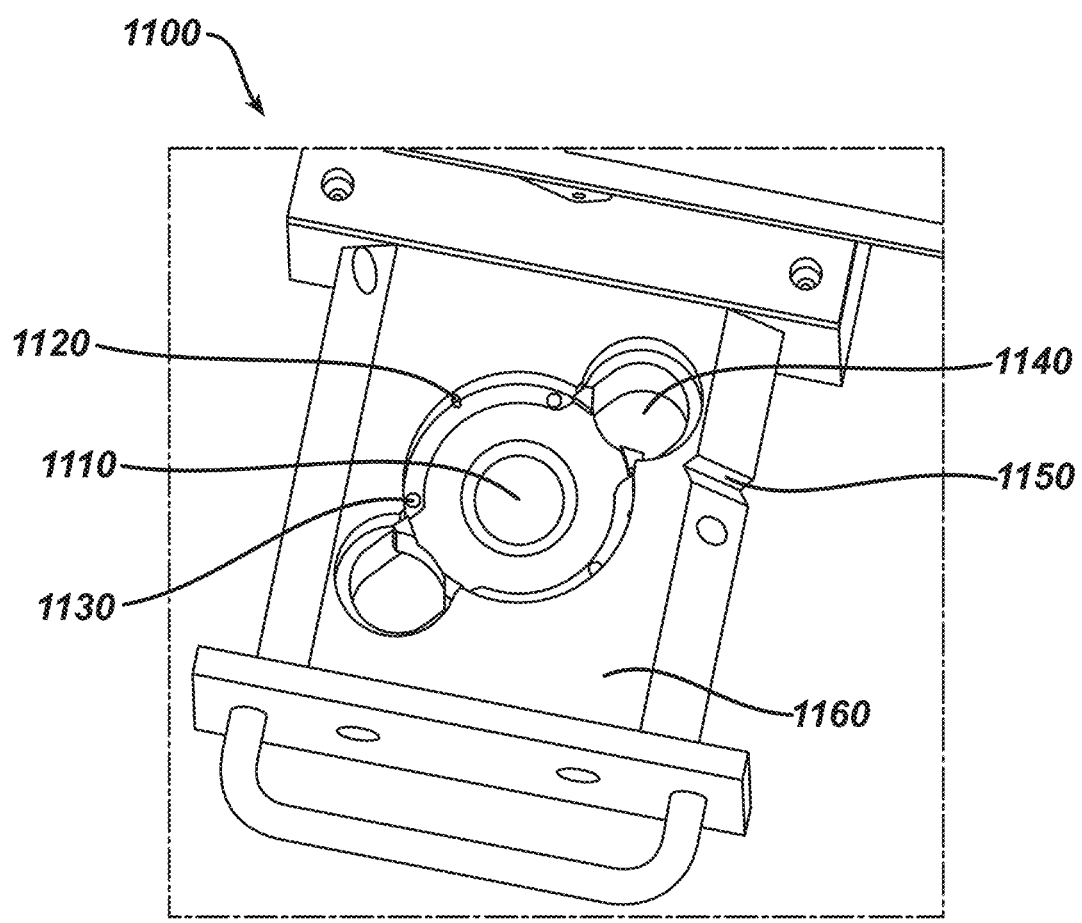
FIG. 11 illustrates an exemplary monomer reservoir that may be useful in implementing some embodiments of the present invention.

Referring now to FIG. 11, the disk 1000, mates with the reservoir system 1100. The flat surfaces sit upon three mating surfaces 1130. Some embodiments may additionally include a spring loaded locating pin 1120 which positively mates and locates to item 1030. Two static locating pins (not illustrated) engage two other flat surfaces on the forming optic assembly and the combination acts to kinematically locate the forming optic assembly, in all degrees of freedom, thus ensuring a repeatable and stable means of locating the forming optic in the optical light path. In some embodiments, a reservoir for containment of the reactive monomer 1110 can also be included. From a more general perspective, there are numerous embodiments, consistent with the inventive art disclosed herein, that may be obvious to one skilled in the art for ways to center a forming optic, to locate such optic in proximity to a reservoir which will contain Reactive Mixture and to locate one or more such functions in an ambient controlled environment.

The forming optic 1010 is at least partially transmissive to a desired spectrum of actinic radiation. Accordingly, in various embodiments, forming optic 1010, may include, by way of example, one or more of: quartz, plastic, glass, or other material transmissive of light wavelengths operative to cure a RMM used. It may further be noted that the shape of the forming optic 1010 includes one of the surfaces 1011 with characteristics to be imparted into a lens or Lens Precursor, formed along the surface 1011 via polymerization resulting from the forming actinic radiation that passes through the forming optic 1010. Numerous shape embodiments may include the inventive art herein.

Within the various embodiments that may be employed for the design and characteristics of a forming optic 1010, individual examples of said pieces may have unique aspects related, for example, to its stock material, manufacturing, history of usage and/or other causes. These aspects may or may not interact with the overall function of the Voxel lithographic system 500, creating unique optical offsets for the Voxel by Voxel intensity profile required to achieve an end product aim. Therefore, some embodiments may employ means to condition forming optics 1010, maintain them and track them. By reason of example, one embodiment may be to encode an identification mark in machine readable format on the flat surface of a forming optic piece 1040. Additional embodiments could include, for example, the attachment of an RF identification device along with said identification mark for machine readability. There may be numerous other embodiments to identify individual forming optic pieces 1040, that may include the intent of this invention.

The output product of the Voxel-based lithography optical equipment 500 may include numerous embodiments. In one embodiment, as shown at 900 a reactive product 940 will form on the surface of the forming optic 930 while still residing in the residual reactive chemical mixture 945. The action of removing the forming optic 930 with reactive product 940, from the chemical mixture 945 may include additional embodiments of the apparatus. In some such embodiments, the forming optic 930 and adhered reactive product 940 may be raised out of the chemical mixture 945 under the action of robotic automation for example.

In some embodiments, an article of manufacture that results from the process discussed may be an entity called a Lens Precursor. The Lens Precursor can be adhered to the forming optic upon formation. A schematic representation 1700 is presented of what may be included in a precursor without the substrate or forming optic that the Lens Precursor may be adhered to. This rough representation illustrates, however, the key features of a Lens Precursor. The reactive product has a solid component, referred to as a Lens Precursor Form, now identified as 1740. In this embodiment, the attached face (without forming optic illustrated) is depicted with an optical surface as 1750. The Lens Precursor Form 1740, will now have a surface 1730 that has been defined by the operation of the Voxel-based lithographic system 500. Adhered to this surface 1730, is a Fluent Lens Reactive Mixture 1745. In such embodiments, media 1745 will remain on the forming optic, wherein they may be exposed to additional processing such as described herein.

Flowable Material Removal Apparatus

The Lens Precursor 1700 which in some embodiments has been produced by a previously described Voxel-based lithography optical system 500, defines a novel entity. A Flowable Material Removal Apparatus (sometimes referred to as a Wicking apparatus) is one set of apparatus which can act upon a Lens Precursor 1700, and is described in detail hereafter.

Figure 12:
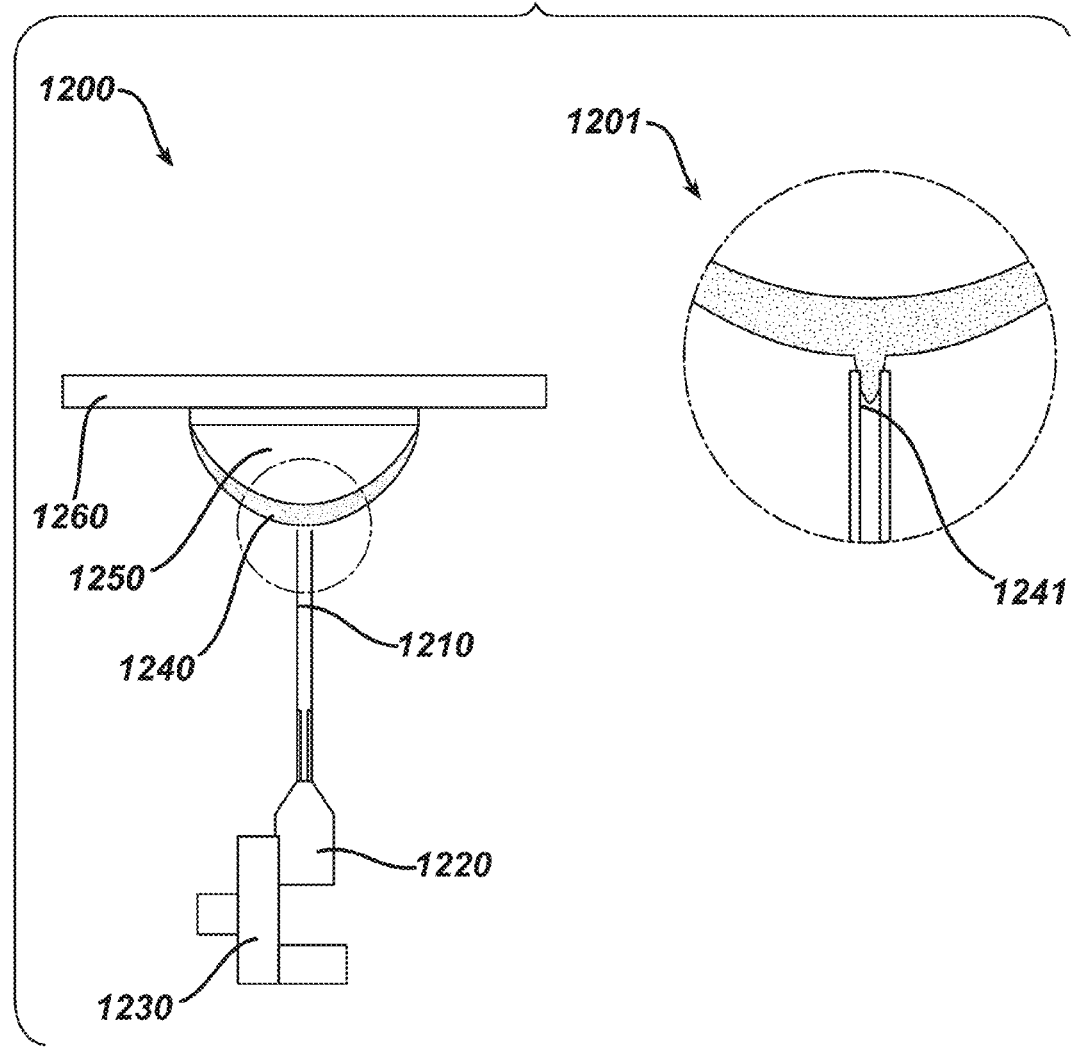
FIG. 12 illustrates an exemplary material removal apparatus that may be useful in implementing some embodiments of the present invention.

Referring now to FIG. 12 1200, a schematic representation of some aspects of an embodiment of a flowable chemical removal apparatus is demonstrated. The Lens Precursor is now demonstrated attached to a forming optic 1250, and an alignment plate 1260 attach thereon. The combination is demonstrated as an embodiment where the Lens Precursor's surface is facing downwards. The Fluent Lens Reactive Mixture 1240, will move under a variety of forces including that of gravity. A wicking capillary 1210, is positioned in close proximity to the Fluent Lens Reactive Mixture 1240, around and in the fluent chemical that has pooled at a low point along the lens surface. In a preferred embodiment the wicking capillary may include a polymer wicking model made from a Safecrit, Model HP8U Untreated Plastic Microhematocrit tube. By way of alternative example, the capillary may also include glass, metal or other material consistent with the physical and chemical/materials requirements of fluent chemical removal.

The fluent chemical 1240, is drawn into the capillary 1210, and forms a volume 1241 that is drawn away from the Lens Precursor. In one embodiment, the process may repeat a number of times. After processing, the Lens Precursor 1200 remains with a reduced amount of Fluent Lens Reactive Mixture adhered to the Lens Precursor Form 1750.

Various aspects of the Fluent Lens Reactive Mixture may be affected by this processing; including for example, that less viscous components in the Fluent Lens Reactive Mixture may be separated and removed. It should be apparent to those skilled in the art that there are many different embodiment options related to how the chemical removal process may be performed, all consistent with the scope of this invention.

In general, embodiment options may include numerous physical designs to draw away chemical from the surface. An example of a different embodiment may be the actuation of a vacuum system component 1220 to assist in drawing away the Fluent Lens Reactive Mixture 1240. By way of non-limiting example, another embodiment may be included of redundant copies of the capillary apparatus 1210, deployed with their points mimicking the shape of the forming optic surface 1250. Additionally, the chemical removal could be performed with a high surface area material, like sponge, or nanoscale materials with high surface area, as an example. Restating a concept described previously, an alternative embodiment may include controlling the rate of withdrawal of a Lens Precursor on a forming optic 930, from the Reactive Mixture 945. The surface tension forces, in this embodiment may include a form of chemical removal, with similarity to a capillary wicking step; and result in the reduction of the amount of Fluent Lens Reactive Mixture 1710 remaining when the Lens Precursor results. From a generality perspective, the numerous embodiments of apparatus that could perform the function of removal of portions of the Fluent Lens Reactive Mixture 1240 include art within the scope of the invention.

The vacuum system component 1220, in the preferred embodiment, has an alternative function to that previously defined. In the processing of multiple Lens Precursors, the chemical removal apparatus 1200 will perform chemical removal numerous times. The vacuum system component 1220, may be used to clean and evacuate the capillary apparatus 1210. A different embodiment may include a cleansing solvent being flowed through the capillary apparatus 1210, in conjunction with the vacuum system component 1220.

Figure 13:
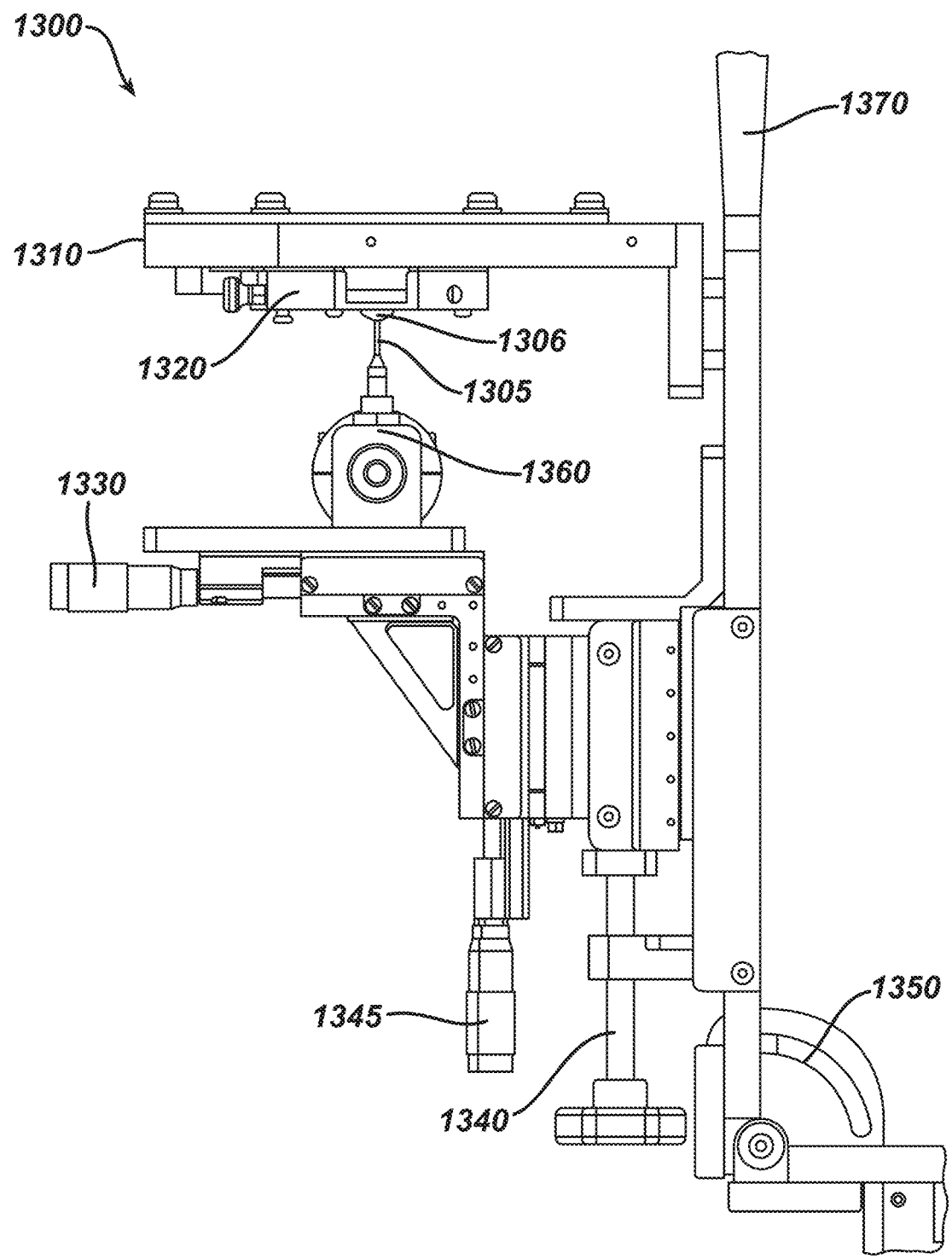
FIG. 13 illustrates the gross motion systems of an exemplary material removal apparatus that may be useful in implementing some embodiments of the present invention.

Generally the embodiments 1200 depicted in FIG. 12 illustrate how a chemical removal system could function, and it focuses in detail and in a close up view, on the components involved. By comparison, FIG. 13, depicts a more global view of some embodiments of a chemical removal system 1300 embodiment to aid in the description both of the equipment employed in a preferred embodiment and some alterations. FIG. 13 1300 includes a capillary removal component 1305 and a Lens Precursor mounted on a forming optic and forming optic plate 1306 in a similar configuration and with the Lens Precursor pointing directly down.

Referring now again to FIG. 13, it may be apparent that the placement of the wicking capillary 1306 may in alternate embodiments be located at a position off of the center of the forming optic Lens Precursor 1305, center point. Item 1330 indicates a single dimension, of a xy translation table, where the adjustment is used to offset the capillary to forming optic center alignment. By way of example, the 1330 is depicted in a preferred embodiment manual vernier adjustment form. However, it may be clear to one skilled in the art that the adjustment may be performed by automation comprising stepping motors for example; and more generally, various levels of escalating sophistication in automation equipment for the location of the XY translation table would be anticipated within this invention. From an even higher level of generalization, and to simplify the following discussion, it may be assumed that any movement capability on the apparatus may have similar freedom in embodiment possibilities.

Item 1320, a forming optic holding apparatus, includes an apparatus to flexibly hold a forming optic in a desired firm location. The forming optic piece, as depicted as 1000 in previous discussion may employ similar location schemes as when located in the Voxel-based lithographic apparatus 500 in this embodiment. Alternative embodiments may enable the transfer of the forming optic holding apparatus 1000 under automated means. It should be apparent that numerous alternatives in manners of holding the forming optic and locking it into an appropriate location in a flowable chemical removal apparatus include consistent aspects of the current invention.

The discussion thus far has generally depicted embodiments with the axis of the forming optic located such that it is perpendicular to a horizontal plane and in the direction of gravitational forces. Alternative embodiments may allow a rotation of the axis at some angle about this perpendicular orientation. Item 1350 includes an adjustment means to alter the angle the forming optic axis makes with gravity. The fundamental effect of such a change would be that the fluent matter 1710 on the Lens Precursor will tend to pool at a location off of the center of the forming optic center. In some embodiments there may be advantages to drawing off fluent media at a location off center.

A number of indicated items in FIG. 13 relate to the location in a vertical manner of a capillary wicking apparatus 1306 to the fluent media on the Lens Precursor. For example 1340 may include a gross or rough adjustment of this dimension by moving the stage affixed to the wicking capillary 1306 along the vertical axis. Additionally 1345, includes a fine level adjustment for the same movement possibility. It is equivalently possible to adjust the forming optic mounting stage 1310 relative to the capillary wicking apparatus 1306 along the same axis. Item 1370 includes a fine adjustment apparatus for this purpose.

For the purpose of moving the wicking capillary into different orientations 1360 includes a rotary motion device. For example, such an embodiment may allow for simplified and automated capability for changing out the wicking device 1306.

As mentioned there may be numerous embodiments which relate to the automation of movements among the various components of the fluent chemical removal apparatus 1300. In addition, however, it is entirely within the scope of the invention for alternative embodiments to include optical measurements for controlling the process of removing chemical. Further alternative embodiments for such monitoring may include, for example, liquid level sensors of various types. By way of generalization, it may be obvious to one skilled in the art that the process of controllably removing in part a fluent chemical mixture from a solid support may require numerous sensing and metrology apparatus.

The spirit of the embodiments relating to apparatus for fluent lens reactive chemical removal discussed thus far includes methods and apparatus for the removal of a portion of the chemical 1710 from the surface of the Lens Precursor Form 1730. It may be apparent to one skilled in the art, that chemical cleaning steps may include embodiments with more aggressive cleaning options. Through use of industry standard cleansing techniques, the fluent lens reactive chemical 1710, may be removed in part or near entirety. By definition, apparatus with such cleansing action would convert the Lens Precursor 1700 into a different form. However, in some embodiments, it may be possible to reconstitute a Lens Precursor after said cleansing technique by applying a Reactive Mixture back upon the Lens Precursor Form's surface 1730, such as, for example via deposition, spraying, ink jetting or wicking.

Other embodiments of chemical removal may not use equipment external to a Lens Precursor Form 1740. Alternatively, since the shape of the Lens Precursor Form 1740, may be defined by numerous embodiments, there are designs of a Lens Precursor Form that may include topographical depressions or channels (Item 440 in FIG. 4 400 includes some exemplary embodiments of such features and is discussed in other sections herein) in certain locations of the Lens Precursor Form 1740. By guiding the Fluent Lens Reactive Mixture 1710 into the channels a reduction in the amount of the Fluent Lens Reactive Mixture 1710 "On" the Lens Precursor Form 1740 may be obtained and may include said alternative embodiment of chemical removal. In general, it may be apparent that in embodiments of this type, the actual shape of the topographic relief features to function in this manner may vary and be generated into a free form surface.

Stabilization and Fixing Apparatus

The Lens Precursor 1700 includes a basis for additional embodiments of apparatus for the customized formation of an ophthalmic lens. The fluent layer of the Lens Precursor, shown in the depiction of one embodiment as layer 1710 provides novel manners to form an optical quality ophthalmic lens surface. When a Lens Precursor is placed upright, the fluent media may move over time. Under certain conditions, for example length of time, the fluent layer may spread under both gravity and surface forces to achieve a stable entity. The surface of the stabilized Fluent Lens Reactive Mixture 1710, can be represented by 1720. Under certain embodiments, a resulting surface 1720, may include an optically superior surface when compared to the surface 1730 of the Lens Precursor Form 1740. Numerous apparatus may provide the functional ability to stabilize the Fluent Lens Reactive Mixture 1710.

Figure 14:
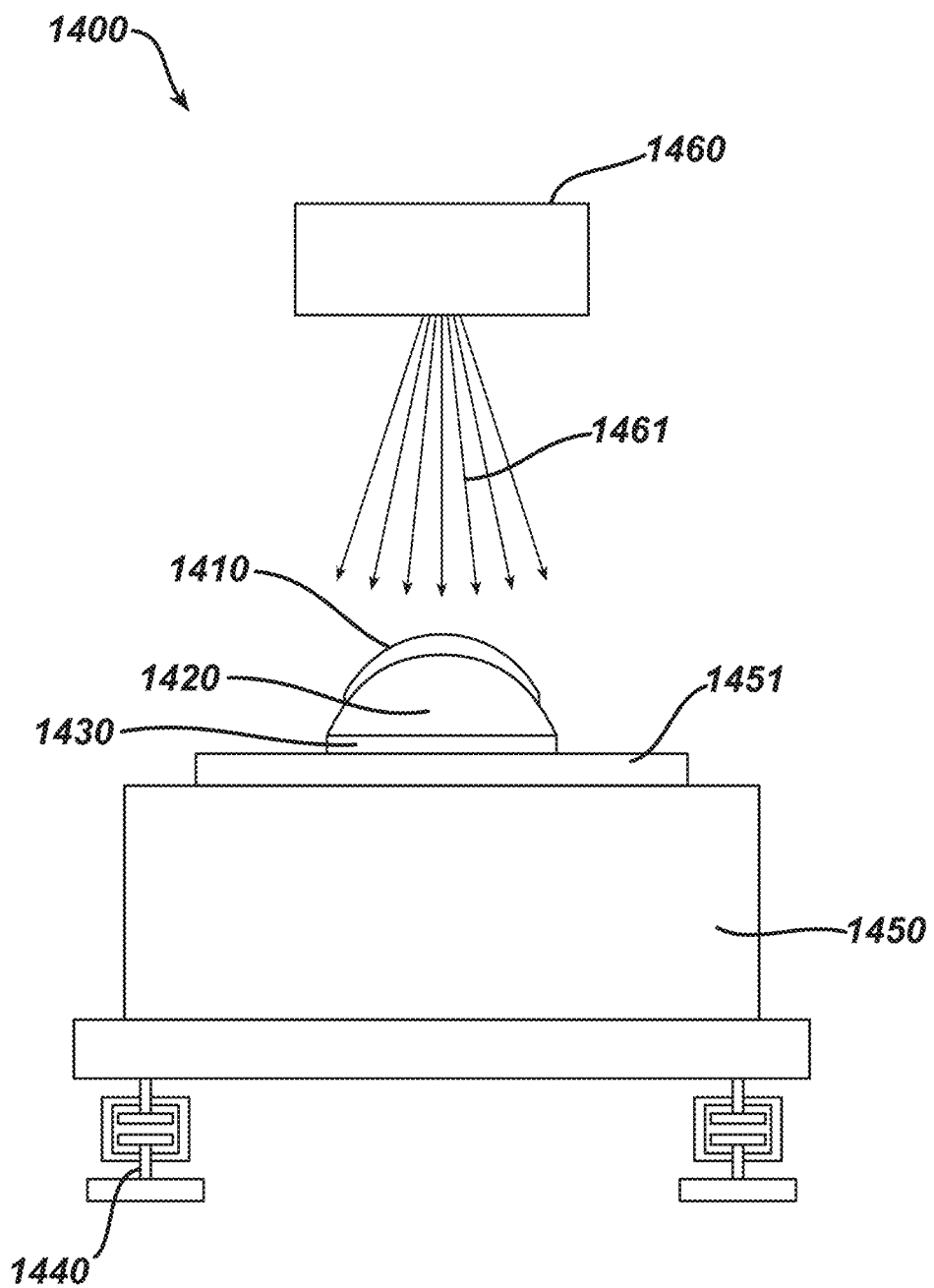
FIG. 14 illustrates an exemplary stabilization and fixing apparatus that may be useful in implementing some embodiments of the present invention.

Proceeding now to FIG. 14, a stabilizing apparatus 1400 in a preferred embodiment is depicted. One aspect allows the flowing system to be isolated from movements or vibrational energy. This is accomplished in 1400 with component 1450. A relatively massive table 1450 can be supported upon a vibration isolation system 1440. As the force of gravity is also employed in such embodiments, it may be preferred for the massive table 1450 to have a flat surface that is level. A Lens Precursor 1410 can be attached to a forming optic holder 1430 which may be attached with a holding apparatus 1451. In some embodiments, automated timing equipment may be used to control a minimum amount of time for the fluent media to achieve a relatively stable state.

In some embodiments, the apparatus used for stabilization includes attached components allowing for the exposure of the Lens Precursor to an actinic irradiation step for the purpose of fixing the Lens Precursor 1700 into a formed ophthalmic lens. In some embodiments, fixing radiation causes photochemical reactions to occur only in the Fluent Lens Reactive Mixture 1710. In alternative embodiments, other parts of a Lens Precursor, such as, for example, a Lens Precursor Form 1740, may undergo one or more chemical changes under the fixing radiation. Other embodiments that constitute variations based on the nature of the materials comprising the Lens Precursor may be obvious to an expert as consistent under the current invention.

In 1400, the source of fixing radiation is identified as 1460. By way of example, a similar light source to that previously discussed in the context of the Voxel—lithography optical system 520 may be employed. For example, in some embodiments, an AccuCure ULM-2-420 light source with controller from Digital Light Lab Inc. (Knoxville, Tenn. USA) 1460 may constitute an acceptable source of the fixing radiation 1461. After the appropriate parameters are performed for stabilization, the controller for the fixing light source 1460 is switched to an on position exposing the Lens Precursor and surroundings to the fixing radiation 1461, and forming an ophthalmic lens of one embodiment form. From a general perspective, there may be numerous embodiments relating to the stabilizing or otherwise moving the Fluent Lens Reactive Mixture across the Lens Precursor Form 1730 surface and then in some manner irradiating with fixing radiation.

By way of example, some alternative embodiments for processing in the fixing apparatus may include a Lens Precursor Form where fluent material may have been washed off in a washing system. As this Lens Precursor Form in a fixed form may include a lens of certain characteristics in its own right, it is within the scope of the invention to anticipate embodiments that involve the use of the fixing apparatus in a manner that does not require the stabilization apparatus per se. In a more general sense, the invention may anticipate numerous embodiments of materials and forms where the fixing apparatus may fix materials that do not require a previous flowing of a fluent material on the surface to be fixed. By way of example, a Lens Precursor Form that has been formed with the Voxel-based lithographic optical system and has Fluent Lens Reactive Mixture 1710 washed off may still include an embodiment where the fixing apparatus is capable of fixing the Lens Precursor into a lens.

One set of embodiments includes alternative manners to cause the movement of the Fluent Lens Reactive Mixture

1710. By way of example, in some embodiments, agitating a Lens Precursor surface including Fluent Lens Reactive Mixture 1710 may enable the movement of the Fluent Lens Reactive Mixture 1710. Additionally, for example, it may be desirable in some embodiments to spin a Lens Precursor around a central axis in a spin coating manner common to film processing.

Still other embodiments may include minimizing gravitational force experienced by the Fluent Lens Reactive Mixture 1710 by way of dropping the Lens Precursor 1410 in a controlled manner over a certain distance. Additional embodiments may alter the effect of gravity by changing the level of the surface 1450 upon which the Lens Precursor 1410, forming optic 1420, and holder 1430, are rested. With a different surface level, the forces on the Fluent Lens Reactive Mixture 1710 in the center optic region may vary and cause movement.

In another aspect, some embodiments may include chemical or physical changes to the Fluent Lens Reactive Mixture 1710. By way of example, an alternative embodiment may include the introduction of a solvent material in and around the fluent reactive chemical in such a manner to change its fluent nature. Additionally, said added material may effect the surface energy properties of components in the Lens Precursor system 1700. The properties of the fluent reactive chemical 1710 may be partially altered through the use of the fixing irradiation 1461, to alter the fluent nature in a manner that is distinct from fixing. Numerous alternative embodiments of a general nature relating to altering properties of the fluent chemical system may be anticipated by the nature of this invention.

At a significantly fundamental level, the nature of the reactive chemical mixture 945 may interact with the various embodiments of apparatus to enable different results. It should be apparent that the nature of the stabilization and fixing apparatus 1400, and variation in embodiments that derive from changing the fundamental chemical components in the reactive chemical mixture include embodiments within the scope of the invention. By way of example, this could include for example changes in the wavelength employed for fixing radiation and may introduce apparatus embodiments that have flexibility in said wavelength of fixation radiation.

As the materials of the Lens Precursor may include part of a formed lens, it may be obvious to one skilled in the art that the environmental controls in and around the stabilization and fixing apparatus include important embodiment aspects. For example, control of particulate matter with, for example, HEPA filtrated air flow may include one embodiment of environmental control. As the fluent media is still sensitive to actinic radiation, controls over stray light entering the environment include additional embodiment options. As well, humidity and other gaseous contaminants may effect lens quality and control over these environmental conditions may include alternative embodiments. The numerous aspects of environmental control that may be apparent to one skilled in the arts include art within the scope of this invention.

The product of treating a Lens Precursor of some embodiment with the stabilization and fixation apparatus may include devices that are similar to or forms of ophthalmic lenses. In many senses this material has characteristics that directly relate to a final, hydrated ophthalmic lens. However, many embodiments after lens stabilization and fixation create an entity, still on the forming optic and holder 1430, that in the non-hydrated form may be subject to various forms of metrology.

Metrology Apparatus

Figure 15:
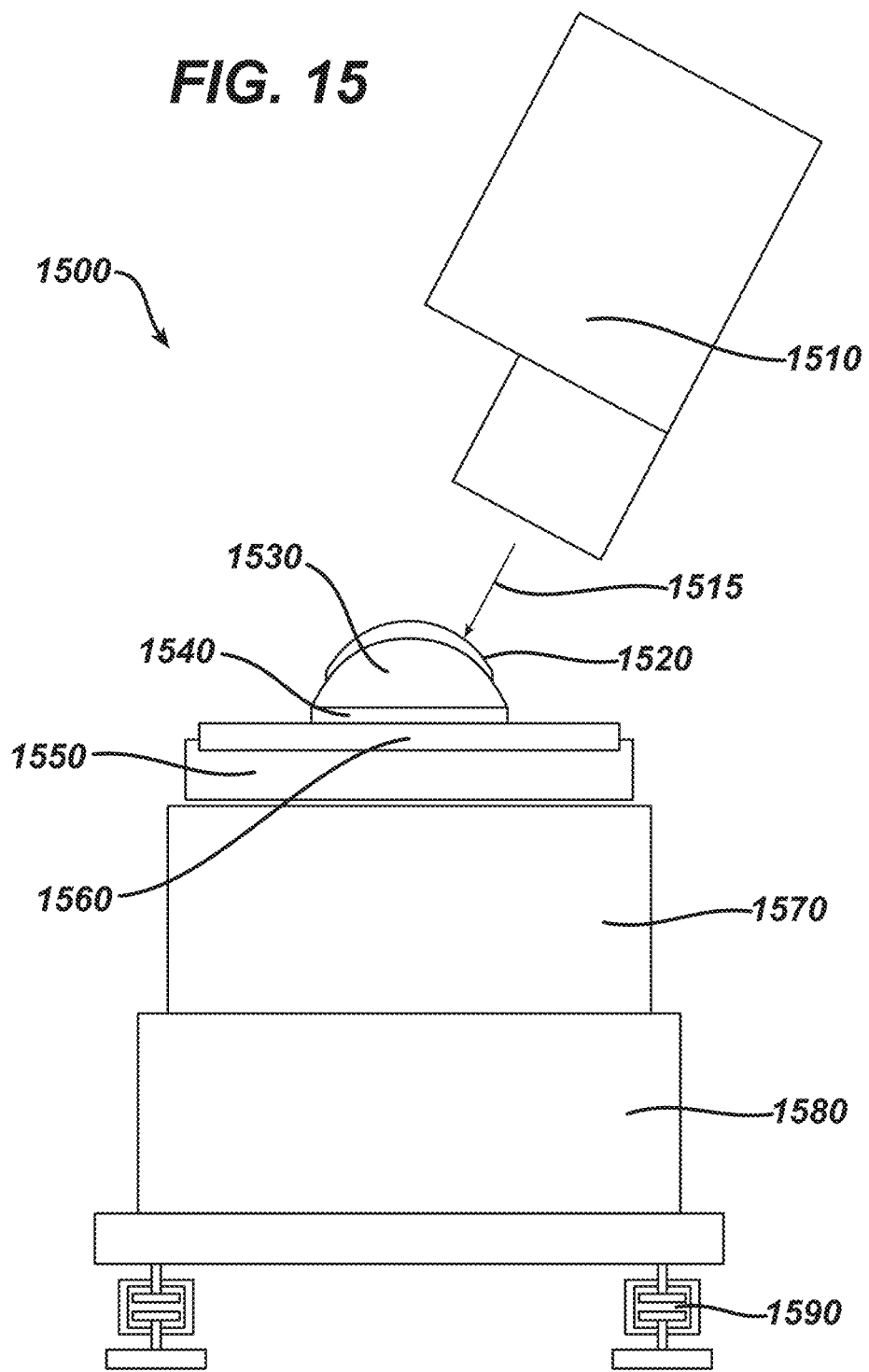
FIG. 15 illustrates an exemplary metrology system that may be useful in implementing some embodiments of the present invention.

Continuing to FIG. 15, a representation of an embodiment of a metrology apparatus capable of measuring optical and material characteristics is displayed. It may be obvious that metrology may be possible with both "dry" lenses, as would be the result following processing with the aforementioned fixation apparatus 1400; and with hydrated lenses. This embodiment, however, focuses on metrology of dry lenses which desirably are still affixed to the forming optic. Referring to FIG. 15, the dry lens 1520, is still affixed to the forming optic 1530 and its appropriate holding components 1540. For an example, this holding component 1540, is affixed to a pair of mounts 1550 and 1560, that together enable controlled rotational movement of the lens about a central axis.

In some embodiments, the interaction of laser light 1515, from a laser displacement sensor 1510 such as one manufactured by Keyence (Osaka, Japan) model LT-9030, with the surface of the lens sample 1520 occurs as the sample 1520 forming optic 1530 and holding clamp 1540 rotate axially. A rotary servomotor 1570, drives a rotary bearing kinematic stage upon which the sample assembly sits. For stability of the rotation, the center of mass of the lens sample assembly is set, in some embodiments, as close to the center point as possible. As the stage rotates, the laser displacement sensor 1510, measures displacement of multiple points along axial rings of the surface of the lens 1520. After the stage rotates a full turn, the displacement sensor 1510 is moved azimuthally. Each movement creates a new circular profile around the surface of the lens. The process in this embodiment repeats until the entire lens surface has been profiled. By measuring a particular forming optic 1530 without the lens sample 1520, the surface location of the forming optic may be obtained in an equivalent spherical notation format. Subtracting this result from the result with the lens upon the optic results in a thickness mapping of the lens product. Again, unique identification of a forming optic in an electronic format, via an attached RFID or by some other means, may include another embodiment form for the apparatus.

In some embodiments of this type, a free vibrational displacement of the sample surface 1520 relative to the sensor 1510 can include a significant error on the displacement measurement obtained by the system. Therefore, vibrational damping and isolation may be included. Accordingly, in some embodiments a massive supporting table 1580 sitting upon vibrational isolation mounts 1590 can be utilized to minimize vibrational effects. Some embodiments may be less sensitive to vibrational noise than others; however, generally speaking various methods of minimizing vibrational energy transfer modes into the environment around the various forms of detectors and the sample locating apparatus include embodiments within the scope of the invention.

Other embodiments may employ different measurement systems, in some cases in addition to the first described laser displacement sensor, to extract lens characteristics. By way of non-limiting example, a Shack-Hartmann Wavefront Sensor available from Thorlabs Inc (Newton, N.J., USA), may also be used in some embodiments to determine thickness of the formed lens body.

From a general perspective, there may be a significant diversity in metrology devices that are anticipated within the scope of this invention, including in part and for example, techniques to characterize the refractive index, radiation absorption, and density. Aspects relating to environmental controls may also be anticipated including for example, particle detection. These various techniques may be located in the same environment and location as the exemplary metrology device 1500, or in alternative embodiments may include additional locations within or external to the generalized system environment.

Collection, storage and communication of metrology and logistical data relating to particular samples and components used in the production of particular samples include a general embodiment principle of the invention. These various data may be useful in establishing feedback loops for control of lens characteristics. In an exemplary and preferred embodiment, the output from the laser displacement sensor based metrology apparatus 1500 for a lens sample 1520 is recorded and stored in a computing system. The individual forming optic piece, in one embodiment 1530, may have had the similar laser displacement metrology performed on it before being used in the production of said sample 1520. Through use of the data computing system the displacement data may be processed in some manner to generate a representation of the thickness of the lens sample thus produced.

Within the computing system a desired model for the lens sample, useful in providing starting parameter set points for the various components in the lens fabrication system, may be compared to the manipulation of the displacement data for the sample, 1520, and forming optic 1530. In some embodiments, various location points in a model may be mapped or correlated back to the individual components of the imaging system; in the preferred embodiment, a particular Voxel element in the Voxel-based lithography optic system. Via adjustment of the parameters for that Voxel, a next lens or Lens Precursor sample may be produced with adjusted performance compared to the previous sample. Within the numerous embodiments of metrology and the various calculational algorithms and apparatus, there should be a clarity to one skilled in the art, that many alternative embodiments of obtaining, processing, modeling, feeding back, and communicating of data include elements within the scope of this invention.

In some embodiments, metrology data of a particular system relating to the thickness of a produced lens sample 1520 may be enhanced via the use of alignment features designed into the profile of a Lens Precursor Form 1720. In the exemplary FIG. 4, 400, thickness metrology obtained in a manner similar to that described above was obtained. Other discussions of this 400 will be made elsewhere in this disclosure; but for use of understanding an alignment embodiment, the 440 may be considered. Item 440 may include a relatively deep profile recess in the surface of a lens sample 1520. The design of such a feature may be useful in orienting numerous processing steps in the apparatus. In one embodiment, the signal related to 400 may be extracted or recognized by an algorithm or manipulation of the metrology data. Such an extraction may be useful in locating portions of the various apparatus that are in proximity to or provide processing upon a location relative to the alignment feature 440. It may be apparent to one skilled in the art that numerous different embodiments of alignment features including the use of marking materials and designs of profile features among others are possible and include art within the scope of this invention.

Some alternative embodiments use of metrology data produced by a metrology system 1500 may utilize this data for diagnostic and control purposes for the entire ophthalmic lens production system or its various apparatus, therein. By way of non-limiting example, storage of the above mentioned measurement of a forming optic 1530, may result in a history of such measurements. Through alternative computation and algorithmic processing, the characteristics of the surface could be compared over time and changes in those characteristics, of either an abrupt or steady manner might be used to flag a need for diagnostic intervention of some kind. One example, in the many possible causes of such a signal change, might include that a forming optic has received a surface scratch of some kind on its surface. In additional embodiments, statistical based process control algorithms could be used to both establish acceptable limits on metrology results obtained and to flag in an automated sense a valid change in measurement. Still additional embodiments may provide means for automation within the system to react to these flags in an automated means. However, from a general perspective, the invention scope anticipates these and numerous other embodiments of using metrology data from, for example, a system 1500, to diagnose and control the overall system.

The embodiments for the metrology apparatus discussed thus far may have generally pertained to metrology on a "dry" lens sample 1520 or its forming optic 1530. From a more general perspective, however, similar or additional metrology embodiments may derive from measuring characteristics of other forms in the total system. By way of non-limiting example, the "dry" lens may in some embodiments continue processing and become hydrated. Metrology on such a newly defined sample 1520, may include an example of the more general embodiment discussion. A further example may include performing metrology on a Lens Precursor sample 1700. Thus, in a general sense, there are numerous embodiments that are anticipated in the scope of the invention to perform metrology on the various forms of material used in processing or in comprising a product in an ophthalmic lens production system of this kind.

Hydration and Removal Apparatus

Figure 16:
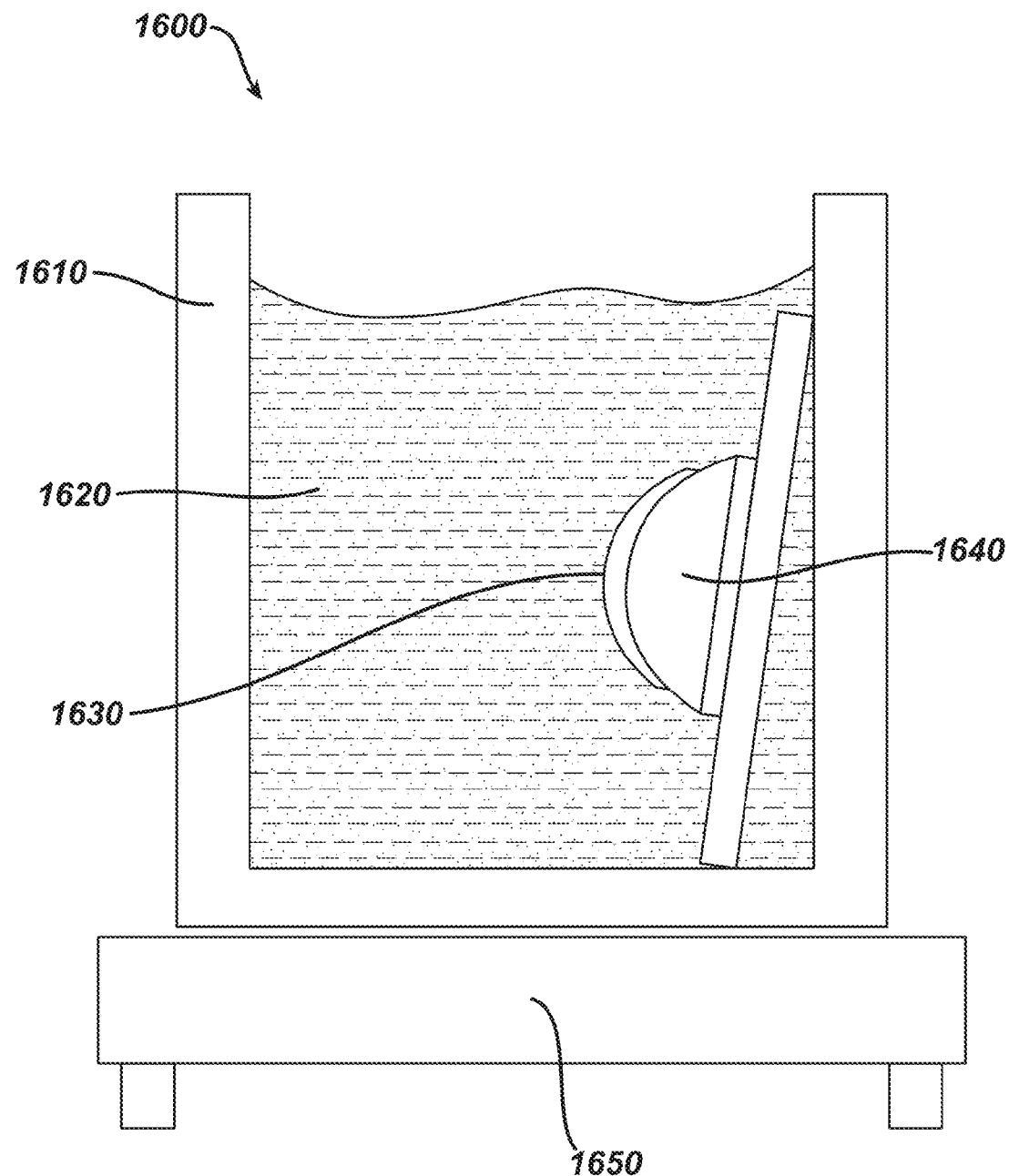
FIG. 16 illustrates an exemplary hydration and removal system that may be useful in implementing some embodiments of the present invention.

Another subsection of the apparatus for the production of an ophthalmic lens includes the steps of removing a lens or Lens Precursor from its forming optic, cleansing it and hydrating it. In some embodiments, these steps may be performed essentially simultaneously. Proceeding to FIG. 16 1600 an embodiment of apparatus to perform these steps, referred to as an hydration apparatus for simplicity, is depicted, The apparatus is included of a vessel for the containment of the hydration fluid 1610, A fluid bath 1620, that a lens 1630, and forming optic holder 1640 are immersed in and a thermal control unit 1650, to maintain the bath at a constant temperature.

In a preferred embodiment, the fluid bath 1620, is included of deionized (DI) water into which a surfactant has been added. There are numerous embodiments for this bath that are practiced in the art and are consistent with the scope of this invention. In an alternate embodiment, the fluid bath 1620, may be included of a mixture of an organic alcohol, sometimes in a mixture with deionized water and a surfactant. Therefore, some embodiments of the vessel 1610, may be included of materials that are consistent with containing a volume of water or organic alcohols and also transmitting thermal energy between a temperature control unit 1650 and the fluid bath 1620. From a perspective of generality, there may be numerous alternative embodiments, comprising materials of vessels, designs of vessels and means of filling and emptying vessels that fall within the scope of hydrating and cleansing a lens and include embodiments of this inventive art.

In some embodiments, the temperature of the bath is elevated to speed the hydration, cleansing and removal operation. In one such embodiment, the temperature may be maintained by the presence of a hot plate with internal sensing apparatus 1650. More advanced embodiments may include alternative manners to heat the fluid including alternative irradiative and conductive materials and apparatus. And, additional embodiments may include different manners to monitor the bath temperature and control it within a temperature zone. A still further and more advanced embodiment could include the ability to vary or program the temperature of the fluid bath in time. It may be obvious to one skilled in the art that numerous embodiments exist to control a hydration bath's temperature that include embodiments within the scope of this invention.

As the exposure of the lens 1630, and forming optic 1640 to the fluid bath proceeds and the lens becomes hydrated, in some embodiments the lens body will swell and eventually detach from the forming optic 1640. Therefore some embodiments may include means of catching the detached lens for assembly into appropriate storage and packaging means. Further embodiments may include, locating and picking the detached lens from the fluid bath media 1620. Alternatively, embodiments may provide the ability to strain said fluid bath media 1620 during a drain process to isolate a lens from the fluid. From a general perspective, numerous manners of localizing a lens and handling it into a storage means include consistent embodiments within the scope of this invention.

However, as referred to above, a lens in a swelled form may include optical characteristics that most match the performance of the lens while the lens is worn by a patient. Therefore, in some embodiments, one or more metrology steps may be performed on the swelled lens. Such embodiments may include similar aspects of feedback, control and diagnostics as has been discussed with other metrology steps, and still additional embodiments may be apparent to an expert that derive from the swelling of the lens in the hydration apparatus.

These subsections include the five major subsections in this invention of an apparatus for formation of an ophthalmic lens. In a preferred embodiment, each has its own embodiment to define the apparatus. However, it may be clear that as each subsection of apparatus may contain numerous alternative embodiments even at a higher level there are alternatives that may exist that either have a different organization of the subsections or alternatively may have one or more subsection omitted and still include an embodiment under the scope of the invention.

Methods

The methodology disclosed in this invention essentially may include five major subsections, and therefore, the discussion of some embodiments of the methods will be organized into logical discussions at the subsection level. The subsections are the methodology concerning production of voxel-based lithographic Lens Precursors, a more generalized methodology of production of Lens Precursors, the various methodology of processing Lens Precursors, the post processing of lenses and Lens Precursors, and the methodology of metrology and feedback amongst the various sections. It should be noted that the following steps and description of methodology are exemplary and are not meant to limit the scope of invention as otherwise presented or set forth in the claims attached hereto.

There are embodiments of methodology which include all subsections or a subset thereof as well, accordingly, the order and inclusion of one or more method steps described does not limit the invention. Referring to FIG. 1, sub-sectional blocks of methodology 100 are identified, and include: a voxel-based lithography methodology 110; alternative forming methodology 120; Lens Precursor processing methodology 130; post processing methodology 140; and metrology and feedback methodology 150. In FIG. 1, two entities are identified in the oval shaped features; they are the Lens Precursor, item 160; and the ophthalmic lens as item 170. The arrows with a single flow may include the general direction that some embodiments may take, and the arrows with two heads on them depict that some or all of, materials, data and information can flow from the various methodology sections to and from the core measurement and feedback section.

Voxel-Based Lithography Methodologies.

The methods of producing Lens Precursors from the voxel-based lithography apparatus include numerous embodiments related to the numerous apparatus embodiments as well as numerous methods to use these apparatus embodiments in the processing of Lens Precursors. Referring to FIG. 1, item 110, the voxel-based lithography methods, there is a beginning step demonstrated as box 115 that may include the initial step in making a lens from this system. Desired lens parameters may be input into an algorithmic calculation. In some embodiments these parameters may have been obtained by measuring optical aberrations on an ophthalmic patient's optical surfaces. These measurements can be turned into the required wavefront characteristics for the lens to be made to. In other embodiments there may be theoretical lens wavefront characteristics that may be input into the algorithm to determine lens production parameters. It may be obvious to one skilled into the arts that there may be numerous method embodiments related to the initial step of defining the desired output lens characteristics.

Continuing with item 115, an algorithm takes the above-mentioned input parameters, and in some embodiments correlates the parameters to previously produced lenses. A series of "frames" may now be determined for the exposure "movie" or script that will be communicated to the spatial light modulator. It may be obvious that there may be a multitude of embodiments related to the methodology that defines the algorithmic treatment of the required parameters that are inputted to an algorithm.

In a like way, there may be numerous methodologies that can be used to convert an algorithmic output for a particular voxel element into the planned light reflection profile in time that would include the "DMD" script. By way of example, the total intensity value desired by the algorithm may be delivered to a voxel location at the reactive mixture as a series of time steps where the input intensity of the light illumination systems is reflected during the entire time. The integrated intensity of these full "on" steps may then be supplemented by another time step where a partial value is written to the mirror element and thus the mirror has a duty cycle "On" level less then full on, for the remaining time steps that will be exposed to the reactive mixture as a whole, this particular voxel element could then be "off" for the remaining duration. An alternative methodology may include, taking the average value of intensity for the number of steps or "frames" that will be delivered and using that value to set the bulk of the frame values that are sent to the DMD. It may be clear to one in the art, that the generality of spatial light modulators discussed in the previous apparatus discussion, as well, have methodology embodiments to correlate with the intent of creating this intensity and time exposure control.

While the above described methods are given examples relating to modulating a fixed intensity applied to the spatial illumination device through the action of the spatial illumination device, more advanced methodologies may derive if the intensity from the light source is modulated either at the source or in the optic system with light filtration. Further embodiments may derive from the combination of intensity control both in the illumination system components and in the spatial illumination modulator. Still further embodiments may derive from the control of the wavelength of illumination.

The method of forming the "DMD" script, which from a general sense should be considered to relate to control signals to any spatial light modulator of any size and also to the control signals of any system component, as for example the light source, filter wheel and the like, may therefore, in general include creating a series of programmed command sequences in time. It may be obvious to one skilled in the art, that there are numerous embodiments relating to the method of creating a control signal program that encompass the many embodiments of the details of the actinic radiation, of the details of the optic system employed and of the details of materials comprising the reactive monomer mixture.

It may be noticed that the details of the "DMD" script and the algorithms may have relationship to results obtained after processing. The feedback of critical parameters will be discussed later, and such detailed discussion is thus deferred. Nevertheless, in terms of the method of creation of a DMD script as shown in box 115, the double headed arrows pointing to and from the voxel based lithography methodology and feedback and metrology methodology refer in part to a role in this information exchange in the methods to create a DMD script.

Another input into the methodology of forming the Lens Precursors, is included by the various methods in formulating and preparing a reactive mixture for the system. In FIG. 1, item 111 is a box representation of the various methodologies included in the reactive mixture. It may be apparent to one skilled in the art that the apparatus embodiments discussed as within the scope of this invention, include a high degree of flexibility as to the type of and makeup of the components within the reactive mixture and it is anticipated as part of the invention, that an abundance of embodiments of the reactive mixture element include the scope of the invention.

Without loss of generality, for example, the chemical constituents acting as monomer units in the reactive mixture may include chemicals that are photoreactive to light in the ultraviolet spectrum, as has been described in some of the embodiments. However, these monomer molecules could likewise be chosen so as to photoreactively absorb radiation in the visible spectrum. Components within the system may likewise be tailored for consistency to another portion of the electromagnetic spectrum. Thus, it may be understood, that the materials methodology relating to this invention may include molecules sensitive to actinic radiation across a large portion of the electromagnetic spectrum.

In some embodiments, the monomer mixture is in reality a mixture of one or more actinically reactive monomer types that is also mixed with other chemical constituents. By reason of non-limiting example, other chemicals may be included as absorbing compounds. Such an additive to the monomer mixture may be, for example, important in embodiments that operate the voxel-based lithography in such a manner that the intensity of the actinic radiation along the path defined by a voxel element may be modeled by the Beer-Lambert-Bouguer Law. This component may largely define the thickness sensitivity of the formation process within the voxel element. It may be obvious to one skilled in the art that an abundant amount of embodiments may include art within the scope of this invention for adding a component to the monomer mixture that absorbs light within a relevant spectral region.

In other embodiments, the absorbing component of the monomer mixture may include additional complexity to that just discussed. For example, it may be within the scope of this invention for a method defining the absorber component to be included of multiple molecules that absorb light in differing manners. Additional embodiments may derive from absorber elements comprised of molecules that have multiple, relevant, bands of absorption themselves. Still further embodiments of methodology may include adding components to the monomer mixture that have a combined monomer and absorber role. This combined role in turn may in some embodiments also allow for a continued absorbance role even after a monomer undergoes chemical reaction. And, the opposite case may include embodiments to the method, where chemicals are added which have the property of altered absorbance as actinic reactions occur. From a general perspective, it may be clear that many embodiments for the methodology of comprising a reactive monomer mixture with a constituent to absorb radiation at one or more relevant spectral bands may be within the scope of the invention.

Additional embodiments may derive if addition of an inhibitor component is included into the method of preparing a monomer mixture. In this sense, an inhibitor compound would have a role in reacting with a chemical product that has formed in the reactive monomer mixture. In some embodiments, absorption of actinic radiation may generate one or more free radical chemical species. An inhibitor may act in reacting with the free radical species, and thereby, end a path of polymerizing reactions. One effect of such an embodiment would be to limit the duration of a photochemical polymerization reaction, or in other ways limit the distance that a polymerization reaction may occur away from the original photoabsorption initiator event. It may be apparent that some embodiments of the addition of inhibitor to the monomer mixture, therefore, may have relevance on the spatial resolution that a collection of photons in a voxel element will ultimately reflect in the spatial localization of the reactions that they initiate. In general, the action of the inhibitor may include numerous embodiments relevant to the art.

The types of chemical species or components of the reactive mixture that may act in an inhibitory manner includes numerous other embodiments of the art. As with the absorber, it is within the scope of the invention for an inhibitor to have dual roles, in inhibiting multiple polymerization pathways. Furthermore, the inhibitor may include a portion of a monomer molecule itself. And, in other manners of generality, the inhibitor may itself have a thermal or photoreactive sensitivity. Still other embodiments may derive from the nature of the inhibitor in its pure chemical state; as it may include a dissolved form in the mixture but exhibit gaseous, liquid or solid characteristics in its pure form.

The method of preparing a monomer mixture may have additional embodiments with respect to the addition of an initiator component. The initiator may include a photoabsorptive component that in absorbing a photon generates a chemical species that precipitates a polymerization reaction. The initiator may include a molecule that absorbs significantly in a particular band. Further embodiments may occur with initiator molecules that are photoabsorptive in multiple relevant bands for the apparatus. Its absorption may include a relatively broad band of relevant frequencies as well. Still further embodiments are possible if the initiator component of the monomer mixture derives from chemical initiator reactivity residing one or more of the monomer molecule types in the monomer mixture as well. Within the scope of the invention, it may be obvious to one skilled in the arts that numerous alternative embodiments may include the methodology of comprising a monomer mixture with a component that acts as an initiator.

In some embodiments, the role of these described additives includes functionality towards the method for formation of an ophthalmic lens. In an example embodiment the monomer mixture used was Etafilcon A, a reactive monomer mixture having general use in the production of ophthalmic lenses.

Referring again to FIG. 3, Etafilcon A includes a monomer component that under polymerization will form solids or gels. Etafilcon A also includes an absorber molecule, Norbloc, which absorbs UV radiation in a band comprising the lower wavelengths in item 300 and depicted for example as item 310. Furthermore, Etafilcon A also includes a component that acts as an initiator, and its absorbance is represented by item 340. In the mixture, the presence of dissolved gaseous oxygen includes an inhibitor role. Thus the methodology for forming a reactive monomer mixture in this embodiment includes both the formulation of a mixture of solid and or liquid components and further includes controlling a level of dissolved oxygen. The description of this embodiment is exemplary, and, therefore it is not meant to limit the scope of invention.

It may be apparent that other embodiments of the method to form the reactive monomer mixture in this invention may derive by control of physical aspects of the monomer mixture. In some embodiments, this may involve the addition of solvents or diluents to alter the viscosity of the mixture. Further embodiments may derive from other methods that result in altered viscosity of the mixture.

In the methodology of the preparation of the monomer mixture, additional embodiments may be defined from treatments performed on the nascent mixture. By way of non-limiting example, the mixture may be subjected to an evacuated environment which may result in the desorption of certain dissolved gaseous species. In another embodiment, the monomer mixture may be treated by exposing the bulk mixture to an exposure of actinic radiation, thus altering the degree and population distribution of multimeric components in the mixture before it is used in a subsequent actinic processing step. It may be obvious to one skilled in the arts that numerous additional embodiments may be possible for the purpose of treating a monomer mixture to result in an altered characteristic; the resulting mixture being useful in the further purpose of producing ophthalmic Lens Precursors and lenses.

Moving along the arrow in FIG. 1, to box 112, the methods for dosing and deposition of the reactive monomer mixture are of relevance. In some embodiments, an amount of the reactive mixture may be equilibrated to have a desired concentration of dissolved oxygen. In some embodiments, the equilibration may be accomplished by storing a vessel containing a significant amount of monomer mixture in an enclosure where the ambient includes the desired amount of oxygen to equilibrate to the desired concentration when dissolved. Additional embodiment may include automated equipment that may exchange the correct amount of oxygen into flowing reactive mixture via membrane technology. It may be obvious to one skilled in the art, that there may be numerous manners to alter or dose the reactive mixture to a desired level of incorporated gas consistent with the scope of the invention.

In some embodiments, a volume of the dosed reactive monomer mixture may now be transferred in a manual means into the reservoir comprising the vessel to contain the mixture in the proximity of the forming optic surface. Other embodiments may include automated mechanisms to fill the reservoir with the reactive monomer mixture. Still further embodiments of the invention may include filling disposable vessels that may be used when needed for the lens forming process. The invention scope includes using a methodology of some kind to fill the reservoir in proximity of the forming optic surface with at least an amount of reactive monomer mixture that is greater than the amount of material which will include a formed lens after all processing.

It may be apparent to one skilled in the arts that with the description of the various apparatus embodiments, material embodiments of the reactive monomer mixture, physical embodiments of the nature of the actinic radiation, and control formalism embodiments of the script and the apparatus it includes, one may now describe some of the embodiments that will form the output of the voxel-based lithography methodology. Moving in the process flow diagram, FIG. 1, item 116 indicates the forming methods that will use these various embodiments. It may be apparent to one skilled in the art that alternative embodiments for each of the components mentioned above may exist and that description of the methods pertaining to certain such embodiments do not limit the scope of the invention herein.

It may be useful to consider some of the methodology of item 116 at a microscopic scale. Consider, by way of non limiting example, an overall forming method where a monomer mixture includes an absorbing element such that there is a significant absorptive reduction upon the intensity with the depth that the imaged actinic radiation has passed through; as may in some embodiments be modeled with a Beer's law formalism. And, for example consider the embodiment depicted in FIG. 3, where the wavelength of the actinic irradiation directed upon a particular voxel element is such that it is in the actively absorbed wavelength region for the initiator included into the reactive mixture and is in a rapidly changing absorption region for the absorber. Also consider, by way of non-limiting example that the monomer mixture includes an inhibitor. For easy reference and description, for this discussion this combination of methodology may be called Example 3. Although this is presented by way of enabling embodiment, it is not meant to limit the scope of the invention and other models may be used.

In one embodiment of Example 3, the inhibitor may be found in a significant concentration in the monomer mixture. At a microscopic level, this example embodiment may have the characteristic that the incident actinic irradiation defines a very limited local region around itself where chemical reaction initiated by the actinic radiation in a particular element will occur at a rate that exceeds the ability of the highly concentrated inhibitor to inhibit its furtherance. Because of the fact that some spatial light modulator systems will have a portion of their surface between each individual modulating element as "dead" space, not reflecting the light in the same manner as the modulating element, it may be apparent that in this embodiment, the resulting material that is formed upon the forming optic surface may take the form of isolated voxel-based columnar elements, that in the extreme may not connect with each other.

By way of continued non limiting examples of embodiments of Example 3, the inhibitor concentration may be found in a somewhat lower concentration and in this embodiment may, for example, be in a concentration where the spatial propagation for a given set of actinic illumination parameters is just far enough so that each of the voxel elements will define actinic activity that proceeds to overlap any border between voxel elements. In such a case on a microscopic basis, the individual columnar elements may tend to blend into each other for illumination conditions where neighboring voxels define significant intensity conditions. In some embodiments, the optical imaging system may be run in a mode where it is de-focused as another method embodiment to drive the individual columnar elements to blend together. In still further embodiments, a vibrational or wobble movement of the forming lens optic and holder in space may drive a similar effect where the voxel elements will overlap each other forming a continuous form piece.

It may be useful to continue describing the effects of the forming methodology at a microscopic basis in the depth dimension of the voxel element. It may be apparent, from the condition of Example 3, that a particular voxel element's "DMD script" may define an integrated intensity or exposure time which causes reaction to occur into the depth of the voxel element away from the forming optic surface. At some particular exemplary depth, this condition may include an intensity driven reaction condition in the monomer mixture where the degree of reaction defines a gel point. At depths that are less then this depth the reaction product may have formed a three dimensional aspect; however at depths greater than this depth, the reaction product may not have reached the gel point and may still include a mixture of components that is more viscous that the surrounding nascent reactive monomer mixture due to some level of monomer reaction that has occurred. In this embodiment, as may be clear, there was sufficient volume or the nascent reactive mixture to at least include these two regions; that is the regions where the reaction has occurred to a higher degree than the gel point, and the region where material includes a non-gelled layer which may be a mixture of partially reacted and unreacted monomer mixture. Under some embodiments, some of this layer may include what is called fluent lens reactive media. At a microscopic level it is being formed within the volume space of the reactive mixture.

In other embodiments, the "DMD script" may be useful to define local design elements into the voxel defined layer that has reacted past the gel point. This entity may be considered a Lens Precursor Form in some embodiments. By way of a non-limiting example, consider the effect of embedding an essentially linear feature into the DMD Script which is a number of voxel elements wide and many voxel elements in length and has the property of low integrated intensity for all voxel elements it includes. Using the embodiments discussed for Example 3, by way of non-limiting example, it may be envisioned that such a linear feature would be defined physically into the Lens Precursor Form. At the microscopic scale, neighboring voxel elements may include intensity to define their thickness in the Lens Precursor Form at some significant level. At the first neighboring voxel element of the linear feature, the form thickness will drop resulting in a profile feature related to the linear feature defined in the DMD script.

By way of example, referring to item 400 in FIG. 4, a representation of the thickness of a lens formed with an entire embodiment of this invention is presented. In this example, the lens thickness shows some features that have the characteristic of the linear feature thus described. Item 440, for example is a linear feature that extends for many voxel elements across a lens. It may be obvious by inference, that the aspects of the invention include many different embodiments of shapes and profile features that may be defined in addition to the optical surface definitions of the lenses. Amongst, the numerous embodiments possible, by way of example there may be alignment features, like for example the embodiment intent of the feature 440. Additional embodiments may include profile features that define drain channels, linear feature extending along an essentially radial path toward the edge of the Lens Precursor Form; wells or bottomed holes in various shapes and sizes; abrupt steps up or down compared to the neighboring average topology; and plateaus or essentially flat features across a subset of the lens definition region. These examples are but a few of the numerous embodiments that may be apparent to one skilled in the art related to the forming step methodology.

Proceeding to step 117 of FIG. 1, in some embodiments the methodology relating to the removal of the material, resulting from step 116, away from the environment of the reactive monomer mixture is described. In some embodiments, one method for this removal may include the process of raising a forming optic with its holding piece and with the Lens Precursor Form from the reservoir of reactive monomer mixture. In other embodiments, the reservoir may be lowered away from the forming optic with the attached Lens Precursor Form. Still further embodiments may derive from automating either the lowering or raising step with equipment capable of controlling the rate of such removal with some precision. In alternative embodiments the reservoir of reactive monomer mixture may be drained in some manner resulting in separation of the forming optic with attached Lens Precursor Form from the reactive monomer mixture. From a general perspective it may be obvious to one skilled in the art that there are numerous embodiments which include step 117, of removing the product of step 116 from the reactive monomer mixture; these embodiments comprising art within the scope of this invention.

Figure 17:
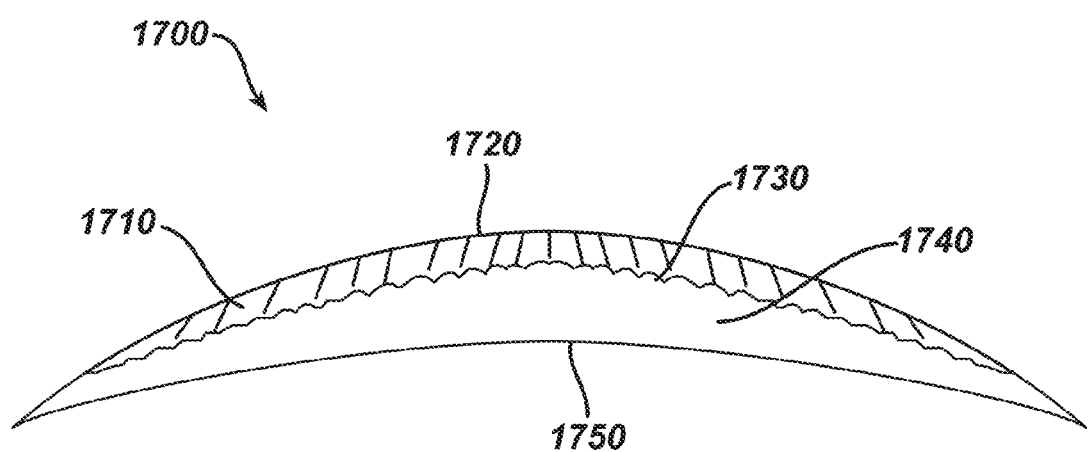
FIG. 17 illustrates an exemplary cross sectional representation of a Lens Precursor.

In FIG. 1, the products and intermediate products are indicated in an oval shaped pattern. Thus, the Lens Precursor 160 in some embodiments includes a device entity. For purposes of understanding other sections with discussion of methodology, a review of the aspects of a Lens Precursor is warranted. The Lens Precursor 1700 may be included of two layers; the Lens Precursor Form 1740 and the fluent lens reactive media, item 1710. These layers correspond in some embodiments to the previous discussion of the methodology of forming. In some embodiments the Lens Precursor Form is the material that has been defined by the voxel based lithographic system and has reacted past the gel point. It may have the various structural embodiments discussed previously. In FIG. 17, the embodiment is portrayed where the voxel columns will have overlapped with each other during the forming methodology.

The fluent lens reactive media 1710 in some embodiments is the layer that is formed by the voxel based lithographic process that is deeper than the point at which the gel point has occurred in the reactive media. When the forming optic and reacted material is removed from the reactive monomer mixture, there may be a viscous material that adheres to the surface of the Lens Precursor Form. In the inventive art herein, this fluent film may in some embodiments be further processed with methods to be described. This combination of a Lens Precursor Form and the fluent material on it that becomes after further processing part of the lens is what makes up a Lens Precursor. It may be apparent that in some embodiments, the Lens Precursor assumes a unique structure. It has a component that includes a three-dimensional shape, however, because of the fluent nature of the adsorbed reactive media, the entity does not have a fixed three-dimensional form. It may be obvious to one skilled in the art that the scope of this invention includes all the various embodiments of form that the methods of forming, item 116, include as well as the different embodiments related to the methods of removing the forming optic from the reactive monomer mixture and their effect on the nature of the fluent lens reactive media.

In some embodiments, item 131, includes the embodiment of methodology to remove portions of the fluent lens reactive media from the Lens Precursor. As may be apparent from the previous sections on the apparatus comprising some embodiments to perform this methodology, there are a number of method embodiments possible for this purpose. By way of non-limiting example, the fluent lens reactive media may be removed by capillary action. In some embodiments, the methodology may include a dwelling step to allow some of the fluent lens reactive media to pool together before the step of capillary action is performed. In still further embodiments, the lens surface may be positioned so that its surface axis is angled relative to the direction of gravity. It may be obvious that numerous embodiments relating to methods to remove fluent lens reactive media with a capillary based apparatus may be possible and include art within the scope of this invention.

In other embodiments, the methodology to remove fluent lens reactive media may include alternative apparatus to the capillary wicking equipment. For example, a method comprising using an absorptive surface to remove the fluent media may include some embodiments. Additional embodiments may relate to methods using apparatus with may capillary points rather than the one described in detail. Still further embodiments may include methods to spin process the Lens Precursor to remove the fluent material. Any of the numerous methods to use an apparatus to remove some of the fluent material, as may be obvious to one skilled in the arts may include aspects within the scope of this invention.

A different type of embodiment to remove material from the top surface of the Lens Precursor may include the method of defining relief features into the lens body for this purpose. In these types of embodiments, features such as the drain channels mentioned in a previous section may be designed for the purpose of creating a location to enable the relatively low viscosity fluent media to flow out of thereby creating below grade space for the relatively higher viscosity to flow into. In further embodiments, the use of spinning of the lens body may also include embodiments to remove lens material in conjunction with designing relief features for the material to flow into. It may be obvious to one skilled in the arts that embodiments comprising the various embodiments of different relief surface design also include art within the scope of this invention.

In some embodiments, it may be possible to bypass the removal of fluent lens reactive media and continue to further processing steps. In FIG. 1, this aspect may be portrayed by the dotted line arrow running from element 160 around box 131.

The next step shown in the embodiments that include the methods of forming an ophthalmic lens may be illustrated in FIG. 1 box is item 132, stabilization. In some embodiments, this novel methodology includes the manner of processing that enables the fluent lens reactive media to flow under various forces to find a stable, perhaps low energy, state along the surface of the Lens Precursor Form. At a microscopic level, it may be evident, that a surface of a precursor form may locally have some level of roughness to it. Numerous aspects of the forming embodiments may determine the nature of this roughness, for example of one such case, the effect of the inhibitor to relatively abruptly stop reaction in the vicinity that it starts. The surface forces of the fluent media, frictional and diffusion forces, the force of gravity and other applied forces combine in many embodiments to create a smooth covering that has flowed over the topography. In the methodology that determines these forces there are numerous embodiment possibilities within the scope of the invention.

In one embodiment, the Lens Precursor may be configured to allow the fluent lens reactive media to flow under the force of gravity. The method to perform this may include the movement of the Lens Precursor into different orientations to aid in flow. Alternative embodiments may include the opposite strategy by maintaining the Lens Precursor in a fixed state with as little movement as practical. Still further alternative embodiments may include subjecting the fluent material to the forces related to spinning the Lens Precursor around an axis. In some embodiments, this spinning may be performed around an axis centered in the middle of the Lens Precursor. In alternative embodiments, said spinning may include rotating the Lens Precursor around an external axis point while either facing the top of the Lens Precursor towards or away from the axis point or at the myriad possible orientations between such. In still other embodiments the Lens Precursor may be processed in a free fall environment to minimize the effect of gravity. It may be apparent to one skilled in the arts that there may be numerous methods related to the application of fluent forces to the Lens Precursor during a stabilization method.

In other embodiments, the fluent nature of the fluent media may be altered by methodology. In some embodiments, the viscosity of the fluent media may be altered by means of dilution or solvation. Alternative embodiments may include evaporating some of the diluent to increase viscosity. An exposure to some level of actinic radiation may include still further methods to alter said fluent films viscosity. There may be numerous embodiments relating to altering the viscosity of the fluent media.

In other embodiments, the surface energy related forces on the fluent lens reactive media may be altered by methodology. In some embodiments this may include the addition of surfactants to the nascent reactive monomer mixture. In alternative embodiments additives or chemical reactants may be added to the Lens Precursor for the purpose of altering the surface energy.

The design of the Lens Precursor Form may include methods to create different flow conditions of the fluent lens reactive media. Channels, as a non-limiting example, may include a means to draw fluent lens reactive media away from a region of the Lens Precursor. In alternative embodiments, design methods relating to abrupt profile change may include methodology for providing altered stabilized states. To an expert in the art, it may be apparent that the may be numerous methods in design of the Lens Precursor that include art within the scope of the invention.

From a general perspective, these various embodiment types should not limit the generality of methods to create a fully stabilized or partially stabilized or unstabilized nature of the fluent lens reactive media in the methodology comprising stabilization. Combinations of the various embodiments for example may be obvious, to an expert in the arts, additional embodiments for said methodology After a methodology of stabilization has been performed the fluent material may in some embodiments be subjected to a next methodology type indicated as item 133, fixation, to convert it into a non-fluent state. In some embodiments, the nature of the actinic radiation applied during the fixing method may include alternatives. The spectral band or bands applied may be an example of one type of methodology embodiment. Alternative embodiments may include the intensity of the radiation applied. In alternative embodiments, the application of various aspects of the fixation irradiation may include time dependency. By way of non-limiting example, an initial wavelength band may include a first step that then is changed to a different band. The universe of embodiments that may be obvious to one skilled in the art for the method of defining the light conditions are within the scope of this invention.

In some embodiments of item 133, the fixation method may include different paths that the irradiation may take. In an example of type of embodiment, the irradiation may occur on the front surface of the Lens Precursor; or alternatively through the back surface. Still other embodiments may derive from multiple sources of irradiation, some perhaps with different light characteristics to create different effects of the actinic radiation in the Lens Precursor entities. Still further embodiments may derive from the fixation method comprising other energy forms than radiation. By way of generality, the numerous methods that may include a fixation step are within the scope of the invention.

In some embodiments, after fixation has occurred, the processing of the Lens Precursor 130, has been completed. This completed product may, in some embodiments, be processed further. This product type includes a good example of the type of art indicated in block 120 of FIG. 1, alternative forming of a precursor. By way of non-limiting example, if the product of the fixation were introduced back into the voxel based lithography methodology a second layer of processing may occur. This multipass aspect introduces many embodiment methodology options.

In some embodiments, the complex Lens Precursor that may be formed from multiple passes which may include by way of non-limiting example, a first step where an ophthalmic lens surface is defined and a second step where profile features are added to the surface. Other complex embodiments of the methodology may include, for example, a first pass through the voxel based lithography system with conditions, as some of the previous examples described, that make for isolated voxel columns along the Lens Precursor Form. A second voxel based lithography step may then include filling in the features between voxel columns with a material of a different characteristic. Continuing a third pass through the system may then define an ophthalmic lens. It may be obvious that the generalization to methodology of multiple passes through the system, each of which may have the abundant different embodiment possibilities discussed, may include a great many different embodiments all within the scope of the invention.

In some other embodiments, the Lens Precursor may be formed by applying a fluent reactive media onto a Lens Precursor Form. For example, the Lens Precursor Formed by way of the voxel-based lithography methods may be subjected to a washing system as an extreme method of removal of the fluent lens reactive media. A Lens Precursor Form will derive from the washing method. In some embodiments, this Lens Precursor Form may next be subjected to a method of adding a next fluent lens reactive media to its surface. The methodology of adding the next fluent media to the surface, in some embodiments may include dipping and removal of the Lens Precursor in methods similar to the embodiments described in item 117. The resulting Lens Precursor may now have a different distribution of monomer and multimeric molecules, or in some embodiments may include different polymer chemistry than that used to form the Lens Precursor Form. It may be apparent to one skilled in the art that numerous embodiments comprising the methodology to apply fluent lens media onto a variety of Lens Precursor Form embodiments includes art within the scope of this invention.

In an alternative set of embodiments, the Lens Precursor Form may be formed by other means than voxel-based lithography. In a first, non-limiting example, various embodiments may be possible by using stereolithography as the basis for forming the Lens Precursor Form. In some embodiments, this stereolithographically formed Lens Precursor Form may have fluent lens reactive media from a removal methodology as in 117, but other embodiments may include adding a fluent lens reactive media to the stereolithographically formed base. Alternative embodiments may be possible by using a masked based lithography process to determining the Lens Precursor Form and then using it in the methods mentioned. Still further embodiments may include the use of a Lens Precursor Form that is formed by a standard cast molding process common in the manufacture of ophthalmic lenses, and then forming a Lens Precursor in the methods mentioned. It may be apparent that the numerous embodiments that form a Lens Precursor Form may include methods for forming a Lens Precursor.

After a Lens Precursor is formed by one of the various method embodiments and then processed by a method embodiment it may in some embodiments form an ophthalmic lens as a result. In some embodiments, the lens will now still be found upon the surface of the forming optic. In most embodiments it as well will need to be cleaned and hydrated to form a product form of ophthalmic lens. In methods that are generally standard to the art, the lens and in some embodiments its attached form may be immersed in a bath of aqueous solution. In some embodiments this bath will be heated to a temperature between 60 degrees and 95 degrees centigrade to aid in the method of immersion. Said immersion methods will in some embodiments, cleanse the lens body and hydrate it. In the process of hydration, the lens will swell and in some embodiments release from the support that it is adjoined to. It may be apparent that within the scope of the invention there may be means of coordinating the processing so that the same support and chemical handling structures may include embodiments for the hydration method as well. It should be noted that preceding steps and description of methodology are exemplary and are not meant to limit the scope of invention.

The resulting product after release in many embodiments includes the formed ophthalmic lens of the invention. It may be obvious that other steps upon this product are useful in the production of an acceptable product ophthalmic lens. The methodology in some embodiments may include standard art for isolating the hydrated lens, packaging it and then subjecting it to a sterilization process, item 142. It may be obvious to one skilled in the arts that the order that these steps include relative to each other and also relative to prior steps may include different embodiments consistent with the invention.

The various embodiments of ophthalmic lens, item 170, resulting from the apparatus and methods described herein include another dimension of the art in this invention. It may be clear to one skilled in the arts that the product of Lens Precursor may have unique forms to it. First the lens at some level is a composite of two hardened layers. One of these, the Lens Precursor Form, is in some embodiments formed by the actions of the voxel-based lithography apparatus and methods. This Lens Precursor Form may have numerous embodiments, some examples of which may be apparent from the previous discussions of methodology.

For example, with some method embodiments, the form may include a set of relatively isolated columnar voxel elements each with a different extension determined by the voxel lithography process. In other embodiments, the Lens Precursor Form may include a completely interconnected set of voxel based columns of material. It may be obvious to one skilled in the arts, that there are numerous embodiments relating to the actual composition of the monomer mixture. Furthermore, as previously mentioned in the context of methodology, the Lens Precursor Form may be formed by various other techniques than voxel based lithography, including but not limited to stereolithography, mask based lithography and machining There are embodiments where the voxel based lithographic form has profile features designed with the voxel based technique; these include but are not limited to linear features, curvilinear features, wells, feature in partial height of the lens or in full height, abrupt changes in topology, plateaus and channels.

Still further, more complex embodiments may derive from the multiple pass aspect of the invention. A Lens Precursor Form, by way of non-limiting example, may be the composite of a first pass through a voxel based lithography step which defines a spherical type profile in the surface with abrupt features in its perimeter. A second pass may define customized ophthalmic parameters into the visibly active portion of the lens. By way of generalization it may be clear that there are abundant embodiments comprising multiple passes through the voxel based lithographic apparatus and methods. Variations may include different means to form the first pass, including the alternative lithography options discussed and, for example, a molded ophthalmic lens. This first lens type material includes a Lens Precursor when it is acted upon in a second pass, and ultimately may define a new lens embodiment.

The nature of the second component of a Lens Precursor, the fluent lens reactive media, in some embodiments, when incorporated into the lens defines novelty in the lens embodiment. When processed with the methodology and apparatus discussed for some embodiments, item 130, these embodiments may include a second distinguishable layer which has a smooth surface. The combination of the numerous embodiments of Lens Precursor Form and the various embodiments of fluent lens reactive media may include novel embodiments of an ophthalmic lens.

Formation of an ophthalmic lens may be enhanced via metrology and feedback 150. Some embodiments may include a straight processing methodology flow from box 116 through to item 170. However, superior embodiments may derive from using methods of metrology to drive controls of the parameters of the various methods employed. In FIG. 1, these feedback mechanisms and flow of information are indicated schematically by the double headed arrows flowing to and from item 150. It may be apparent to one skilled in the arts that numerous metrology embodiments may include art within the scope of this invention.

Figure 2:
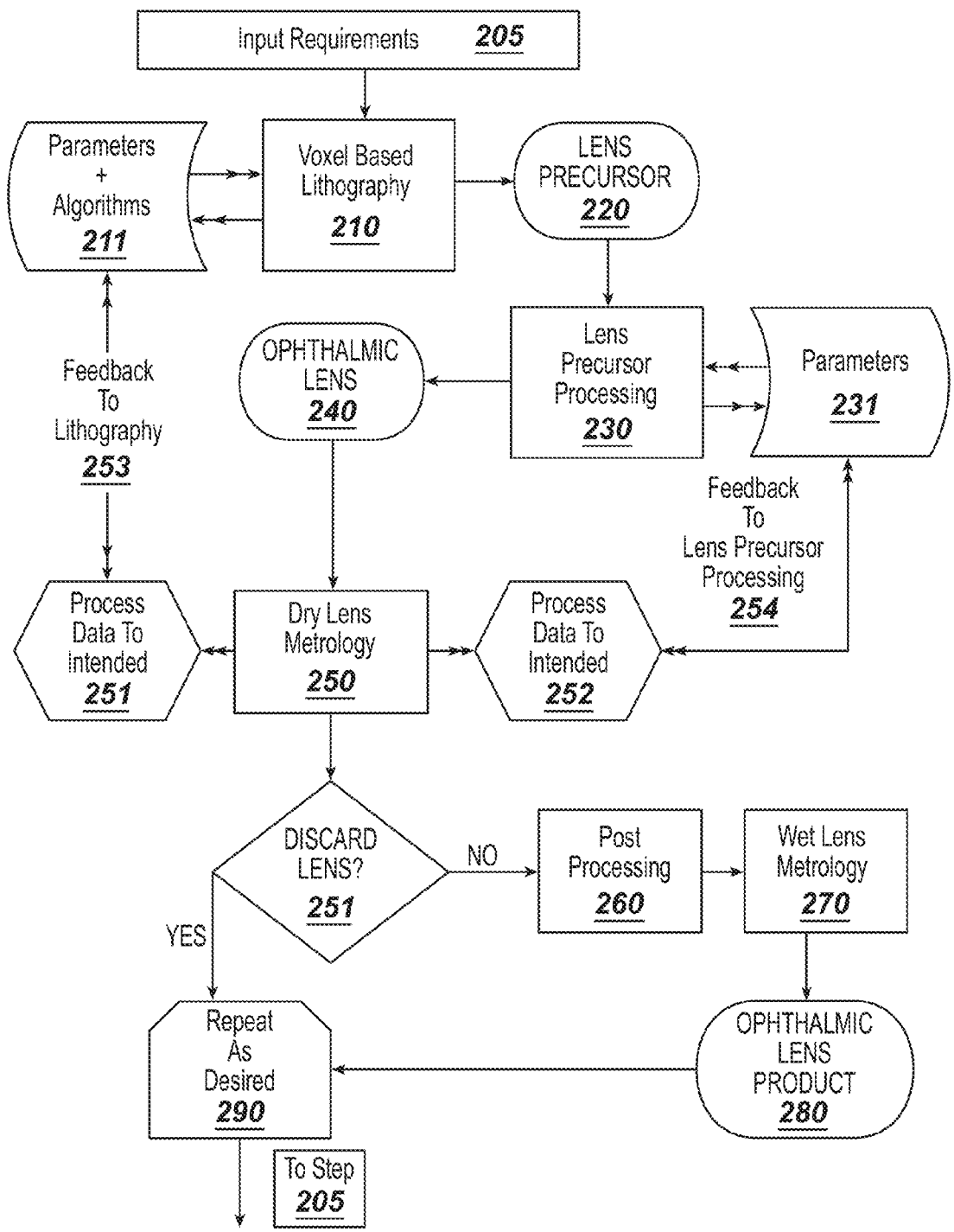
FIG. 2 illustrates additionally method steps that may be used to implement some embodiments of the present invention.

Proceeding to FIG. 2, an exemplary embodiment of a metrology and feedback loop methodology related to the thickness and optical performance of a lens embodiment formed by the voxel based lithographic methods is depicted. In some embodiments, there may be a feedback loop that functions as depicted in item 200, starting with item 205 representing the input of desired lens parameters from an external source. For exemplary purposes, the model of the lens surface may come from an ocular measurement device applied to a patient's eye. In other embodiments, theoretical input parameters may include the methodology of step 205. These inputs will be processed in some methodology to align them with the input requirements of the voxel based lithography 210. The various apparatus and method embodiments will receive this input and, in some embodiments, with an algorithmic method convert them to useable parameters in the voxel based lithography system 211.

Proceeding further in FIG. 2, a Lens Precursor is made in the voxel based lithography system as shown in item 220. It may subsequently be processed with the Lens Precursor processing methodology 230 resulting in a "dry" form of an ophthalmic lens 240. This dry ophthalmic lens may now be measured in a metrology step 250. For exemplary purposes, this step may include use of a laser displacement sensor. Again by example, the surface topology result from this measurement may in some embodiments appear as is shown in FIG. 4, item 400. Algorithms may process this data, as depicted in items 251 and 252 to compare the result to what would be expected if the lens matched the input parameters from step 205. In some embodiments, differences from the input parameters may be processed and correspond with a need to change the parameters used to process the lens in the voxel based lithography system 211. This feedback loop of data and parametric information is depicted in the feedback loop of item 253. The data may also be processed and correspond to parameter changes desired in the Lens Precursor processing methodology 252. Feedback of desired changes to parameters in this system 252 is depicted by the feedback loop 254. It may be apparent that the various computational and control methodology may be performed on various data processing equipment including but not limited to mainframes, personal computers, industrial computers and other similar computational environments. It should be noted that the steps shown in FIG. 2 and the description of related methodology are exemplary and are not meant to limit the scope of invention.

The results of the metrology step 250, and the various processing of the data 251 and 252, in some embodiments may include the ability to decide whether the produced lens 240, is within a set of acceptable limits around the input parameters of item 205. A decision on this lens is then shown in item 251 where the lens may be discarded for another lens to be produced with altered parameters. Alternatively, the lens may be within acceptable limits and therefore proceed onto step 260 for processing in the post processing methodology and apparatus embodiments. After the lens is then swelled and released it may be subjected to another metrology methodology as shown in item 270. In some embodiments, the result of this metrology could have similar feedback embodiments as has been indicated for step 250 in this embodiment. After an ophthalmic lens product is realized 280, the processing flow may join the flow where the dry lens was rejected. Thereafter it is possible for the entire flow to loop back to step 205 in a step indicated by the condition return step of 290. It may be apparent to one skilled in the arts that there are numerous modifications, additions and alternatives in performing a metrology step on the various products of this invention and then devising a feedback loop that incorporates the measured results and adjusts the system parameters.

In some slightly different embodiments, an additional type of measurement may gauge the quality aspects of the lens for global equipment feedback. As a non-limiting example, a particulate detection scheme may be deployed in some embodiments to measure the presence of such defects in the produced Lens Precursor. If such a measurement gave a result flagging a particulate issue, there could be a feedback loop that might in some embodiments involve feedback to an operator of the apparatus and methodology to remedy the issue flagged. It may be obvious to one skilled in the art that numerous metrology embodiments may include art within the scope of this invention where a measurement result is feedback to an operator.

In still further embodiments, the use of logistic data may include an element of a feedback loop. As mentioned in discussions of the apparatus of the invention, in some embodiments key components of the apparatus may have identification. This component identification may be tracked, in some cases, by an automation apparatus. The feedback may include, for example, that a particular component has been used for a particular aspect that includes its useful life. The feedback may in some embodiments be made to an operator, or include automated responses of the system. In still further embodiments that use component identification, results of the previous metrology embodiments, where thickness results effect parameters of the system, the unique identification of a component, as for example the forming optic piece, may allow for individual tailoring of otherwise global parameters to that particular component. It may be obvious to one skilled in the art that the invention described herein includes numerous embodiments of various forms to obtain logistic and metrologic data, to process that data by various algorithmic means and by various data processing equipment, to discriminate that data from input lens requirements and to provide means to feedback that data to the system itself or to operators external to the system; all of which are considered within the scope of this invention.

Example 1

Various embodiments of the invention have been practiced and lens products and Lens Precursors of the forms discussed herein have been produced. In this section a discussion of results from one set of embodiments is given as an example.

The apparatus for performing the results in this example comprised the following general aspects. A Voxel-based lithography optical apparatus was used to form a Lens Precursor. This apparatus, from a general perspective, was comprised with a light source of the preferred embodiment type operating at 365 nm. A homogenizer with an optical pipe and focusing optics, as discussed was used to illuminate the Texas Instruments DLP™ XGA Digital Mirror Device. The imaging system further comprised imaging optics onto a forming optic of the type depicted in FIG. 10.

The intensity profile and DMD pixel values were calculated based on the optical absorbance and reactivity of the reactive monomer mixture which was comprised of Etafilcon A. This system has absorbance characteristics as demonstrated in FIG. 3 with the irradiation peak 320, at 365 nm, and the forming peak 330, at 420 nm. This system's absorbance characteristics are consistent with a Beer's Law absorbance formalism, and this was used to estimate the correct intensity and time program for each of the roughly 768×1024 Voxel elements deployed across the face of the forming optic.

For illustration purposes, the Beer-Lambert-Bouguer formalism is what was used to model the needed intensity. The model results in a parametric dependence based on this formalism and variables related to both the materials, like Etafilcon A, and the apparatus. The results from lens making passes are then fed back in such a way to refine the model parameters and generate a lens. The logic of the model follows.

Beer-Lambert-Bouguer Law:

Beer's law predicts that the intensity of actinic radiation will decrease exponentially in a material, depending on the extinction coefficient $\alpha(\lambda)$.

$$I(x)/I_0 = \exp(-\alpha(\lambda)cx) \quad \text{Equation 1}$$

The rate of intensity decrease with distance is $$dI/dx = -\alpha(\lambda)cI_0\exp(-\alpha(\lambda)cx) \quad \text{Equation 2}$$

Where $I(x)$ is the intensity as a function of distance x from the irradiated surface, I0 is the intensity incident at that surface, $\alpha(\lambda)$ is the absorption coefficient of the absorbing component as a function of wavelength ($\lambda$), and c is the concentration of the absorbing component in an otherwise relatively transparent medium. Therefore, by selecting the wavelength of the radiation, the process can be tuned to select the intensity gradient (i.e., the larger the $\alpha$, the more rapid the change in properties and hence the thinner the lens).

Figure 3:
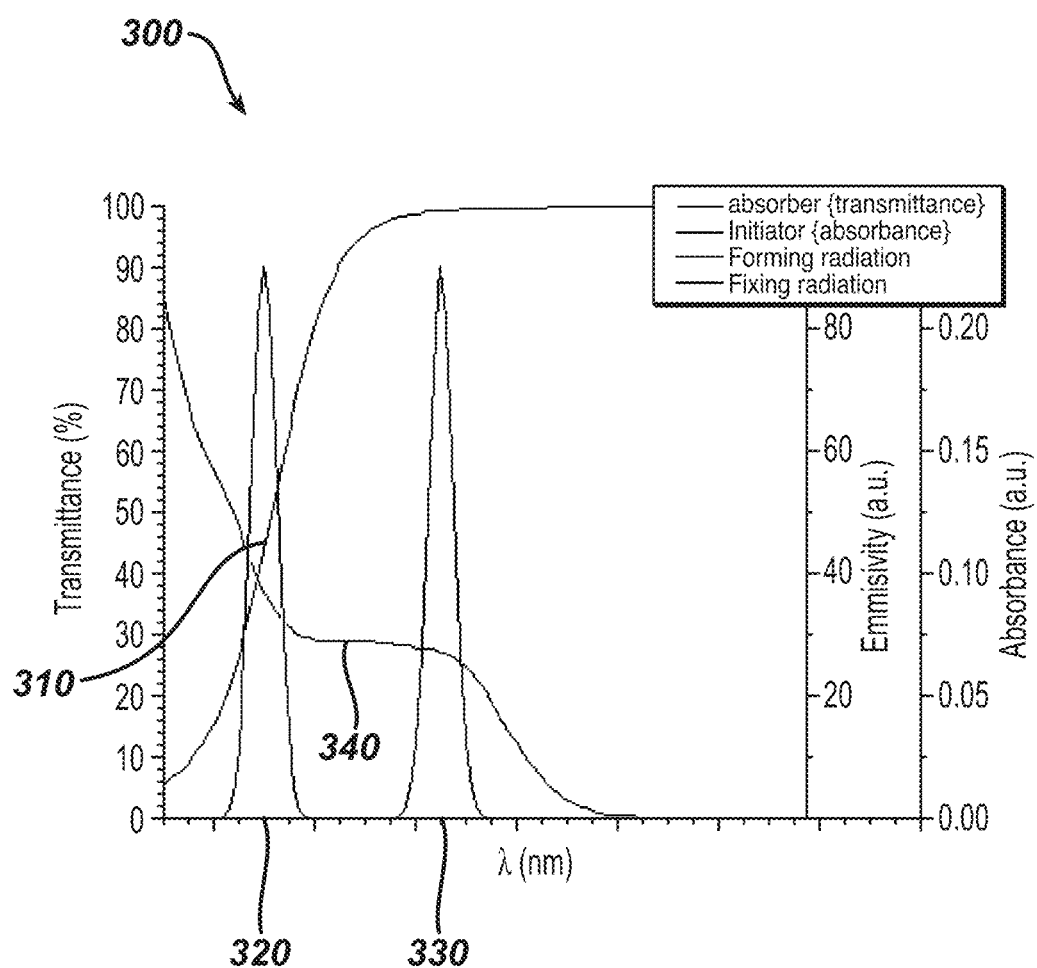
FIG. 3 illustrates an example of the relationship among absorbance and transmittance with forming and fixing radiation.

Referring now to FIG. 3, Item 300, the transmission spectrum of a Reactive Mixture, showing the transition region due to the absorber 310, the overlap with the absorbance spectrum of the initiator 340, and the emission spectrum of the forming 320, and fixing 330, radiation sources.

The polymerization rate of radically mediated polymerization in a reactive monomer mixture follows the general rate equation where polymerization rate (Rp) is equal to the concentration of reactive functional groups ([C=C]) multiplied by the radical concentration ([·]) and a kinetic parameter (k)

$$Rp = k[C=C][\cdot] \quad \text{Equation 3}$$

The radical concentration is strongly dependent on the initiation rate and termination mechanism. Typically, radical-radical/bimolecular termination is the primary termination mechanism. The change in radical concentration with time is equal to the rate of initiation ($R_i$) minus the rate of termination.

$$d[\cdot]/dt = R_i - k_t[\cdot]^2 \quad \text{Equation 3}$$

Assuming steady state ($d[\cdot]/dt=0$), and solving for the radical concentration, it is seen that the radical concentration varies with initiation rate to the ½ power. Thus, the polymerization rate depends on the initiation rate to the ½ power.

$$[\cdot] = (R_i/k_t)^{1/2} \quad \text{Equation 4}$$

$$R_p = k[C=C](R_i/k_t)^{1/2} \quad \text{Equation 5}$$

By considering activation energy (E), ideal gas constant (R), Temperature in Kelvin (T), polymerization rate scaling ($\beta$), and the Arrhenius front factor ($k_0$), the polymerization rate is expressed:

$$R_p = k_o e^{-E/RT}[C=C](R_i/k_t)^\beta \quad \text{Equation 6}$$

The rate of photochemical initiation is given by:

$$R_i = k'I \quad \text{Equation 7}$$

Where I is the intensity of the radiation and k' is a constant concerning the quantum yield. Assuming all parameters and initiator concentration remain constant throughout the reaction, the expression can be simplified such that all parameters that are constants are lumped into k.

$$R_p = ke^{-E/RT}[C=C](I)^\beta \quad \text{Equation 8}$$

Polymerization rate is the rate of change of functional group concentration with time ($-d[C=C]/dt = Rp$), and therefore the equation can be expressed as:

$$-d[C=C]/dt = ke^{-E/RT}[C=C](I)^\beta \quad \text{Equation 9}$$

Upon solving the differential equation and substituting in for conversion, where conversion is expressed as $X = 1 - [C=C]/[C=C]_o$;

$$X = 1 - \exp[-ke^{-E/RT}(I)^\beta t] \quad \text{Equation 10}$$

where t is the exposure time in seconds.

If the Reactive Mixture contains an absorber that absorbs radiation at the wavelength of the actinic radiation, the extent of conversion will vary as a function of the intensity, and therefore as a function of the distance from the surface, according to Beer's law. By inserting the Beer's law relationship into the kinetic equation, we can predict the extent of conversion as a function of distance, x, from the surface.

$$X(x) = 1 - \exp[-ke^{-E/RT}(I_0 e^{-\alpha cx})^\beta t] \quad \text{Equation 11}$$

By recognizing that the free-formed surface will be created at the boundary where the degree of conversion is at the gel point (i.e., $X = X_{gel}$), the thickness, $x_{Thick}$, of the lens can be predicted by rearranging the equation to solve for x:

$$\ln(1 - X_{gel}) = -kt\exp\left(-\frac{E}{RT}\right)(I_0 \exp(-\alpha c x_{Thick}))^\beta \quad \text{Equation 12}$$

$$\left(\frac{-\ln(1-X_{gel})}{kt\exp\left(-\frac{E}{RT}\right)}\right)^{1/\beta} = I_0\exp(-\alpha c x_{Thick}) \quad \text{Equation 13}$$

$$x_{Thick} = \frac{-1}{\alpha c}\ln\left(\frac{1}{I_0}\left(\frac{-\ln(1-X_{gel})}{kt\exp\left(-\frac{E}{RT}\right)}\right)^{1/\beta}\right) \quad \text{Equation 14}$$

$$x_{Thick} = f(I_0, t) \quad \text{Equation 16}$$

$X_{gel}$ is the extent of conversion at which the formulation transitions from a liquid to a solid due to the crosslinks that are formed during the photo-initiated reaction. After rearranging the equation and solving for $x_{Thick}$ at a particular conversion $X_{gel}$, the thickness of the film can be calculated. By keeping all other parameters and properties constant a desired thickness at any x,y location on the surface can be estimated by varying $I_0$ and exposure time, t. The desired thickness may also be estimated on a Voxel by Voxel basis where i and j represent the row and column coordinates of a particular Voxel and $x_{Thick_{ij}}$ is the formed thickness of that same Voxel.

$$x_{Thick}(x,y) = f(I_0(x,y), t(x,y)) \quad \text{Equation 17}$$

$$x_{Thick_{ij}} = f(I_{0_{ij}}, t_{ij}) \quad \text{Equation 18}$$

$$x_{Thick_{ij}} = \frac{-1}{\alpha c}\left[\ln\frac{1}{I_{0_{ij}}} + \ln\left(\left(\frac{-\ln(1-X_{gel})}{kt_{ij}\exp\left(-\frac{E}{RT}\right)}\right)^{1/\beta}\right)\right] \quad \text{Equation 19}$$

$$x_{Thick_{ij}} = \frac{-1}{\alpha c}\left[\ln\frac{t_{ij}^{-1/\beta}}{I_{0_{ij}}} + \ln\left(\left(\frac{-\ln(1-X_{gel})}{k\exp\left(-\frac{E}{RT}\right)}\right)^{1/\beta}\right)\right] \quad \text{Equation 20}$$

$$x_{Thick_{ij}} = \frac{1}{\beta\alpha c}\ln t_{ij} + \frac{1}{\alpha c}\ln I_{0_{ij}} - \frac{1}{\alpha c}\ln\left(\left(\frac{-\ln(1-X_{gel})}{k\exp\left(-\frac{E}{RT}\right)}\right)^{1/\beta}\right) \quad \text{Equation 21}$$

$$x_{Thick_{ij}} = \quad \text{Equation 22}$$
$$\frac{1}{\beta\alpha c}\ln t_{ij} + \frac{1}{\alpha c}\ln I_{0_{ij}} - \frac{1}{\beta\alpha c}\left(\frac{E}{RT} + \ln(\ln(1-X_{gel})^{-1}) - \ln k\right)$$

$$x_{Thick_{ij}} = \quad \text{Equation 23}$$
$$\frac{1}{\alpha c}\left(\ln I_{0_{ij}} + \frac{1}{\beta}\left(\ln t_{ij} - \left(\frac{E}{RT} + \ln(\ln(1-X_{gel})^{-1}) - \ln k\right)\right)\right)$$

$$x_{Thick_{ij}} = A(\ln I_{0_{ij}} + B(\ln t_{ij} - C)) \quad \text{Equation 24}$$

$$x_{Thick_{ij}} = A\ln I_{0_{ij}} + AB\ln t_{ij} - ABC \quad \text{Equation 25}$$

Typical values for the parameters (Table 1) in the equation may be estimated from the analysis of kinetic data.

TABLE 1

Parameters in Equation 14

| Parameter | Units | Value | Description |
|---|---|---|---|
| E | kJ/mol. | 12.0 | Activation Energy |
| R | J/K mol. | 8.31451 | Gas Constant |
| T | °K | 333 | Temperature |
| k | | 1.3 | Rate Constant |
| $X_{gel}$ | | 0.2 | Conversion at Gelation |
| β | | 0.5 | Kinetic Factor |
| $I_0$ | mW/cm$^2$ | 10 | Intensity |
| α | μm$^{-1}$ | 1.3 | Extinction Coefficient |
| c | | 0.01 | Concentration |

Figure 19:
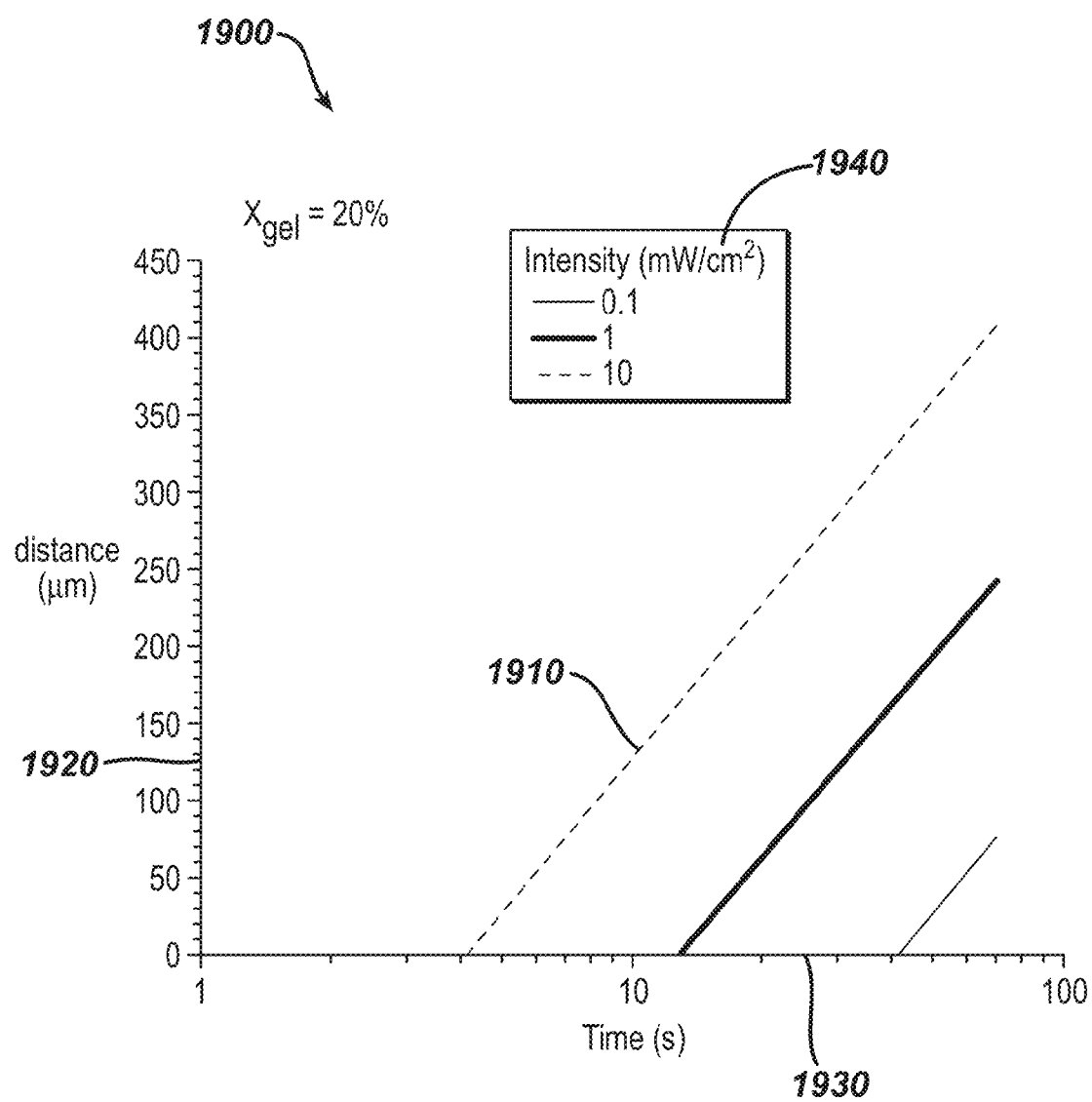
FIG. 19 illustrates an exemplary model output for formed thickness versus time of exposure at various exposure intensities.

Using this model and the reference parameters shown in Table 1, a plot of the distance the free-formed surface is from the irradiated surface as a function of time and intensity (assuming an Xgel of 20%) is graphed in FIG. 19. The estimate of a distance of the free formed surface from the surface of the forming optic surface is plotted as 1920, versus the time of irradiation 1930. And, these values are displayed for calculation of three different incident intensity 1940. As may be clear from the discussion, since the product of this irradiation will be a Lens Precursor 1700, the distance is an estimate of the thickness of the Lens Precursor Form 1730, for a given intensity and time of intensity. Following the discussion of the DLP™ apparatus above, since this apparatus operates as a digital intensity control the time would be related to the integrated time that a mirror element spent in the on state. The intensity that actually occurs at a particular Voxel location may be measured precisely by some technique, but the power of the apparatus is that a measurement of the produced lens product of a first pass may be compared against the target thickness, and the difference may be used to drive a time difference for a particular intensity by referring to the relationship in FIG. 19. For example, if the intensity reaching a Voxel location with the mirror "on" is 10 mW/cm$^2$, then referring to FIG. 19 1910, the adjustment that would result from the model could be found by sliding along the curve 1910 to a new thickness target and generating a new time parameter. The controlling algorithm may use this calculated time target to adjust the time of exposure on each a series of "movie" frames to and average amount that in total equals the target time. Or in another manner, it could use the maximum time per frame and then a last intermediate frame could have a fraction of the maximum time per frame and then the remaining frames could have an off state defined. In some manner, the adjusted time may then be used to make a next lens and the process repeated.

After the exposure, the Lens Precursor was removed from the Reactive Mixture reservoir and processed with the fluent chemical removal apparatus as shown in FIGS. 12 and 13. The lens was then stabilized as discussed in related sections. Then the lens was stabilized with a radiant exposure of 420 nm, a point where the absorber in the Etafilcon A, Norbloc, no longer absorbs incident light significantly. The lens was then measured and subsequently hydrated with the apparatus mentioned above.

Actual lenses have been made in this manner with Etafilcon A, reactive monomer mixture and measured for their optical power. The measured optical power, in Diopters, is presented in the following table for two lenses.

TABLE 2

Data from Produced Lenses

| Device Number | Target Optical Power (Diopter) | Measured Optical Power (Diopter) |
|---|---|---|
| 1 | −5.75 | −5.55 |
| 2 | −5.75 | −5.92 |

In a similar sense, process conditions were used to make another lens using the same chemical system, Etafilcon A and the lens was measured using a transmitted wavefront interferometer apparatus. In FIG. 4, the difference signal between a forming optic and the produced lens is shown as 400, a mapping of the topography of the lens produced. Of note, the optical zone of the lens shows well formed topography by the concentric circular lines 410. The surface is a quality ophthalmic lens device.

In the production of lens 400 and its measurement, there are features that were designed into the lens and occur as features on the topographic mapping. For example 420, includes drain channels programmed into the Lens Precursor Form with programmed low intensity during the exposure movie. A different type of channel is measured as 440. This item 440, includes a long channel, useful as an alignment mark for the lens surface. This feature is replicated in similar form on the other side of the lens and just above the indicated feature 440 to create a clear orientation of the lens surface front, axially, in space.

TABLE 3

Exemplary Parameters for Lens 1+ 2

| Description | Parameter |
| --- | --- |
| Reactive Monomer Mix Dose | 300 μL |
| Reactive Monomer Mix | Etafilcon A |
| Reactive Monomer Mix O2 | 7% |
| Environment Voxel Based Lithography-O2 | 7% |
| Environment Precursor Processing-O2 | 0% |
| Forming Exposure at Optic | 102 μW/cm$^2$ |
| Number Image Sequence | 128 Frames |
| Total Exposure Time | 115 Sec |
| Coalescing Time-Convex Down | 30 Sec |
| Wicking Steps | One |
| Post Wicking Time-Convex Down | 60 Sec |
| Stabilization Time | 200 Sec |
| Fixing time | 240 Sec |
| Fixing Intensity at optic | 4 mW/cm$^2$ |
| Hydration Fluid | DI w/300 ppm Tween |
| Hydration Temp | 90 C. |
| Hydration Time | 15 Min |

Example 2

Figure 10:
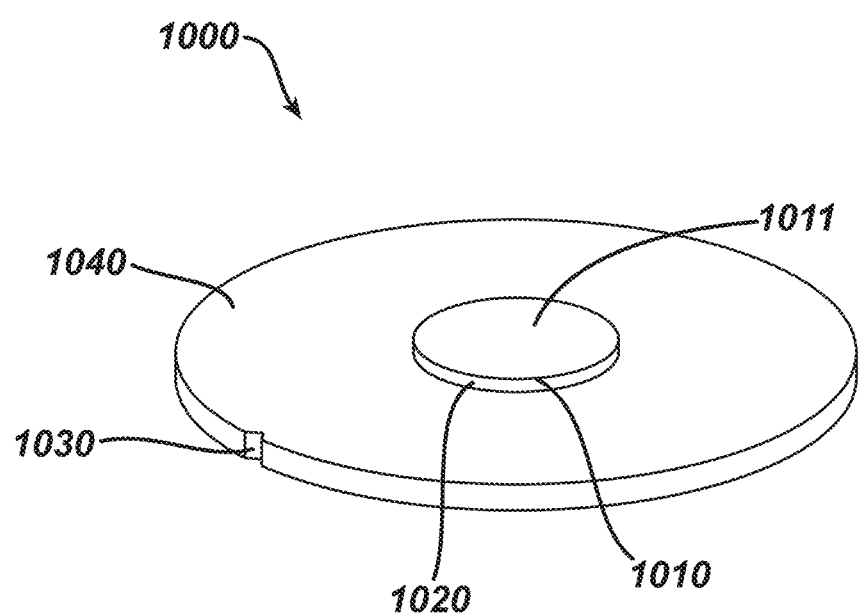
FIG. 10 illustrates an exemplary forming optic that may be useful in implementing some embodiments of the present invention.
Figure 18:
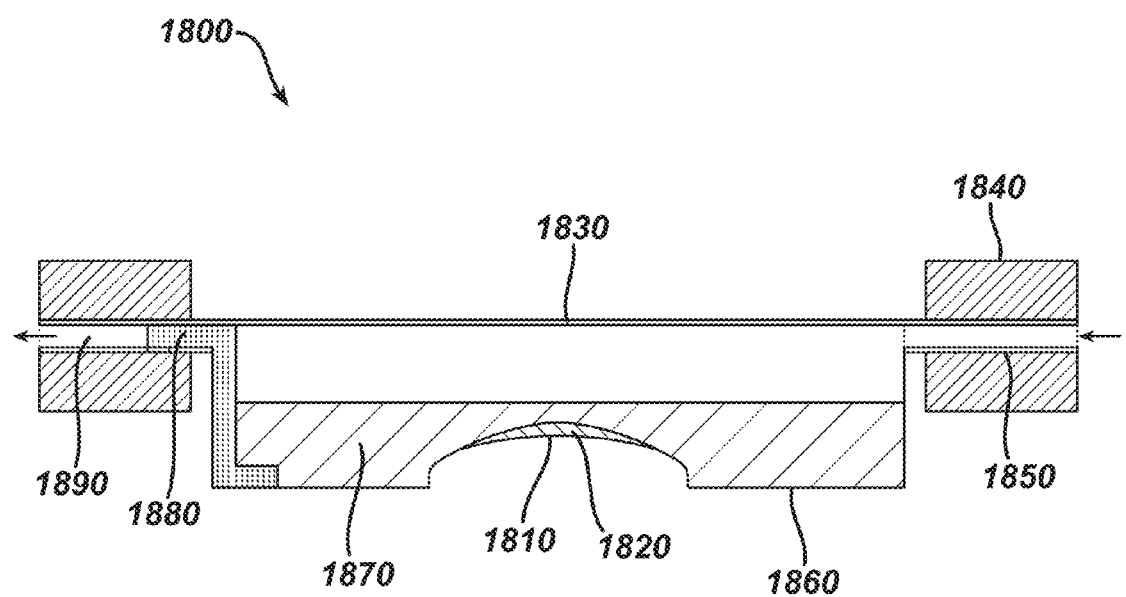
FIG. 18 illustrates an exemplary cross sectional representation of a combined lens forming optic and reactive monomer mixture reservoir.

In this section a description of a specific embodiment alternative for a forming optic component 580 is given in FIG. 18 1800. Again, the forming optic is the support upon which a Lens Precursor or lens may be built. Its depiction as 1000, FIG. 10, may be the most straightforward for this discussion. FIG. 10, in one embodiment described already, may depict a solid optic of substantial mass 1010, with an optical grade surface formed upon it 1011. The alternative embodiment 1800, discussed here replaced the massive element 1010, with a mold piece 1810, that may be much like mold pieces commonly comprising the volume production of standard ophthalmic lenses by current production standards. In such a case the mold piece may have been formed by injection molding to a standard optical form.

The resulting plastic form could have additional shaping around the optical surface, which is similar to 1011, comprising a well surrounding the optical surface 1860. Additional complexity may derive by forming into the same plastic format, tubes 1850 and 1890, that may be useful in flowing fluids during the use of the various apparatus. In a similar manner, the forming optic could be centered within a larger metal piece 1840, like 1040 and its associated elements. In this exemplary cause however, the periphery of the plastic molded forming optic could seal with a pressure fit between two metal pieces in a similar shape of 1040. The resulting composite fixture would be useful from this point to function similarly to some embodiments of 1000; however, in one piece it may include both the function of the optic 1000 and of the reservoir 1110 and 1140.

In use, this exemplary one piece form of the mold, well and holding apparatus may now be loaded into an equivalent position (Around 580 in FIG. 5) in the Voxel-based lithography optical system 500. Some embodiments of this exemplary alternative may include having a top plastic piece 1830, formed over the forming optic and well. This would then define a volume of space that the above mentioned tubes might flow fluids into.

An alternative embodiment of the Voxel-based lithography optical system, may be to define the light path as coming up from a lower location through the forming optic surface 1810, rather than coming from above. This would allow the well around the forming optic to be filled over the internal forming optic surface with lens forming Reactive Mixture 1870, during an appropriate step.

Based on the design of the forming optic surface and the desired lens optical characteristics a series of programmed images may be calculated to irradiate Reactive Mixture with the alternative embodiment forming optic and well. Reactive mixture 1870, may be filled into the well by some means, to a level overflowing the forming optic surface. The same filling tubes 1850 and 1890, may now flow a passivating gaseous mixture over the top of the lens Reactive Mixture in much the same manner as it did in embodiment items 990 and 960. After the irradiation step through this forming optic embodiment is performed, the exit tube 1890, on the form may be closed off by some means at this point, and then pressure from inlet gasses 1850, may now force the remaining Reactive Mixture 1870 out the drain 1880. Resulting on the surface of the forming optic may now be a Lens Precursor 1820, of the type demonstrated in 1700.

Proceeding from an exemplary perspective, if the design of the Lens Precursor included drain channels sufficient to self wick the lens of sufficient Fluent Lens Reactive Mixture, then the lens may be allowed to be processed in a lens stabilization step in the formed plastic optic, support and well comprising this alternative embodiment.

By shinning fixing irradiation through the plastic form, the Lens Precursor may be altered to a lens in a similar manner as discussed previously. A metrology step, if it may look through a plastic layer between the lens and the metrology apparatus, could provide the compliance of the lens characteristics to desired performance. The flow tubes may now be used to flow heated aqueous media with surfactant though the lens chamber and perform the hydration, cleansing and removal step. And, in some embodiments some or all of the plastic form may include a storage vessel into which the appropriate storage media is filled as the lens is packaged.

CONCLUSION

The present invention, as described above and as further defined by the claims below, provides methods of forming Lens Precursors and ophthalmic lenses and apparatus for implementing such methods, as well as the Lens Precursors and ophthalmic lenses formed thereby.

The invention claimed is:

1. An apparatus for processing an ophthalmic lens precursor having an optical quality concave surface and an opposing convex surface, the apparatus comprising:

a substrate for supporting the ophthalmic lens precursor, wherein the substrate includes an optical quality, convex ophthalmic lens precursor forming surface having a contour substantially complementary to said concave surface of the lens precursor to be processed; and a fluent material removal device which can be positioned to remove fluent material from the convex surface of the ophthalmic lens precursor supported by the substrate; and said apparatus for processing further comprising a source of fixing radiation, and said substrate further being comprised of a material capable of transmitting therethrough said fixing radiation.

2. The apparatus of claim 1 wherein the fluent material removal device includes a capillary fixture and said removal of fluent material includes a draw of the fluent material away from the ophthalmic lens precursor.

3. The apparatus of claim 1 further comprising a washing system capable of removing fluent material from said lens precursor.

4. The apparatus of claim 1 wherein the precursor support includes a mold part comprising a lens forming surface and the apparatus further includes:

a dwelling location where the mold part can be positioned wherein flowable chemical residue may flow across a near surface region of the lens precursor.

5. The apparatus of claim 4 additionally comprising environmental controls for adjusting atmospheric conditions of said dwelling location.

6. The apparatus of claim 5 wherein said environmental controls comprise mechanisms for adjusting one or more of: temperature, humidity, particulates, light and gaseous ambient.

7. The apparatus of claim 1 further comprising a hydration mechanism for providing hydration fluid to one of: a lens precursor and an ophthalmic lens attached to the substrate.

8. The apparatus of claim 7 wherein the hydration mechanism provides a hydration fluid capable of swelling the one of: a lens precursor and ophthalmic lens.

9. An apparatus for forming an ophthalmic lens based upon a lens precursor having an optical quality, concave surface and an opposing convex surface, the apparatus comprising:

a light source capable of emitting actinic radiation;

a homogenizer positioned to receive light from the light source and provide a more uniform intensity of light than the light received;

a spatial light modulator reflecting at least a portion of the light provided by the homogenizer;

a converging lens system converging light reflected by the spatial light modulator;

a mold part comprising a lens forming surface having an optical quality convex surface and being transmissive of sufficient converging light reflected by the spatial light modulator to comprise actinic radiation, said convex surface being substantially complementary to said concave surface of said lens precursor;

a vessel for containing reactive mixture around the lens forming surface in an amount in excess of an amount required to form the lens precursor;

a material removal device operational to remove fluent reactive mixture from the convex surface of the lens precursor;

a dwelling location where the mold part can be positioned such that flowable chemical residue may flow across the near surface region of the lens precursor; and wherein said apparatus for processing further comprises a source of fixing radiation sufficient to fix unreacted and partially reacted monomer comprising the lens precursor to form the ophthalmic lens based upon the lens precursor.

10. The apparatus of claim 9 wherein the mold part includes quartz.

11. The apparatus of claim 9 additionally comprising a waste light trap.

12. The apparatus of claim 9 additionally comprising environmental controls for the dwelling location said environmental controls capable of increasing or decreasing one or more of: temperature, humidity, particulate, light and gaseous ambient.

13. The apparatus of claim 9 additionally includes a capillary fixture capable of removal of fluent material away from the ophthalmic lens precursor.

* * * * *